United States Patent
Baeck et al.

(10) Patent No.: US 11,581,038 B2
(45) Date of Patent: *Feb. 14, 2023

(54) SEMICONDUCTOR DEVICE FOR SELECTIVELY PERFORMING ISOLATION FUNCTION AND LAYOUT DISPLACEMENT METHOD THEREOF

(71) Applicant: SAMSUNG ELECTRONICS CO., LTD., Suwon-si (KR)

(72) Inventors: Sang-Yeop Baeck, Hwaseong-si (KR); Tae-Hyung Kim, Hwaseong-si (KR); Daeyoung Moon, Yongin-si (KR); Dong-Wook Seo, Hwaseong-si (KR); Inhak Lee, Daegu (KR); Hyunsu Choi, Suwon-si (KR); Taejoong Song, Seongnam-si (KR); Jae-Seung Choi, Hwaseong-si (KR); Jung-Myung Kang, Suwon-si (KR); Hoon Kim, Goyang-si (KR); Jisu Yu, Seoul (KR); Sun-Yung Jang, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/412,588

(22) Filed: Aug. 26, 2021

(65) Prior Publication Data
US 2021/0383861 A1  Dec. 9, 2021

Related U.S. Application Data

(60) Continuation of application No. 16/566,002, filed on Sep. 10, 2019, now Pat. No. 11,183,233, which is a
(Continued)

(30) Foreign Application Priority Data

May 13, 2016 (KR) .................. 10-2016-0058860

(51) Int. Cl.
 *G11C 11/419* (2006.01)
 *G11C 7/08* (2006.01)
 (Continued)

(52) U.S. Cl.
 CPC .............. *G11C 11/419* (2013.01); *G11C 7/08* (2013.01); *H01L 23/5286* (2013.01);
 (Continued)

(58) Field of Classification Search
 CPC ..... G11C 11/419; G11C 7/08; H01L 23/5286; H01L 27/092
 See application file for complete search history.

(56) References Cited

U.S. PATENT DOCUMENTS 3,983,543 A   9/1976   Cordaro
4,384,220 A   5/1983   Segawa et al.
(Continued)

FOREIGN PATENT DOCUMENTS

CN    1774768 A    5/2006
CN    101540195 A   9/2009
(Continued)

*Primary Examiner* — Mushfique Siddique
(74) *Attorney, Agent, or Firm* — Sughrue Mion, PLLC

(57) ABSTRACT

A semiconductor device includes an active area extending in a first direction, a first transistor including a first gate electrode and first source and drain areas disposed on the active area, the first source and drain areas being disposed at opposite sides of the first gate electrode, a second transistor including a second gate electrode and second source and drain areas disposed on the active area, the second source and drain areas being disposed at opposite sides of the second gate electrode, and a third transistor including a third gate electrode and third source and drain areas disposed on the active area, the third source and drain areas being disposed at opposite sides of the third gate electrode, and the first gate electrode, the second gate electrode, and the third
(Continued)

gate electrode extending in a second direction different from the first direction. The second transistor is configured to turn on and off, based on an operation mode of the semiconductor device.

20 Claims, 18 Drawing Sheets

Related U.S. Application Data division of application No. 15/417,807, filed on Jan. 27, 2017, now Pat. No. 10,453,521.

(60) Provisional application No. 62/288,750, filed on Jan. 29, 2016.

(51) Int. Cl.
*H01L 23/528* (2006.01)
*H01L 27/092* (2006.01)
*H01L 27/11* (2006.01)

(52) U.S. Cl.
CPC ........ *H01L 27/092* (2013.01); *H01L 27/1104* (2013.01); *H01L 27/1116* (2013.01)

(56) References Cited

U.S. PATENT DOCUMENTS

| | | | |
|---|---|---|---|
| 6,074,903 A | 6/2000 | Rengarajan et al. | |
| 6,977,833 B2 | 12/2005 | Day et al. | |
| 7,509,613 B2 | 3/2009 | Frenkil | |
| 7,681,164 B2 | 3/2010 | Lin et al. | |
| 7,712,066 B2 | 5/2010 | Gasper, Jr. et al. | |
| 7,849,431 B2 * | 12/2010 | Kim | H01L 27/0207 716/119 |
| 8,324,668 B2 | 12/2012 | Huang et al. | |
| 8,334,708 B1 | 12/2012 | Cha et al. | |
| 8,378,419 B2 | 2/2013 | Anderson et al. | |
| 8,773,929 B1 | 7/2014 | Lesea | |
| 9,117,510 B2 | 8/2015 | Yang et al. | |
| 9,142,629 B2 * | 9/2015 | Nishizaki | G06F 1/3287 |
| 2003/0058027 A1 | 3/2003 | Kwon | |
| 2004/0156230 A1 | 8/2004 | Satomi et al. | |
| 2005/0088901 A1 | 4/2005 | Day et al. | |
| 2006/0145266 A1 * | 7/2006 | Zushi | H01L 27/1203 257/369 |
| 2006/0146638 A1 | 7/2006 | Chang et al. | |
| 2007/0164806 A1 | 7/2007 | Gasper, Jr. et al. | |
| 2007/0168899 A1 | 7/2007 | Frenkil | |
| 2009/0064072 A1 | 3/2009 | Lin et al. | |
| 2010/0127333 A1 * | 5/2010 | Hou | H01L 27/0207 257/E27.06 |
| 2011/0147765 A1 | 6/2011 | Huang et al. | |
| 2012/0126336 A1 | 5/2012 | Anderson et al. | |
| 2014/0001563 A1 | 1/2014 | Rashed | |
| 2015/0188544 A1 * | 7/2015 | Heo | H03K 19/018521 327/437 |
| 2016/0085904 A1 * | 3/2016 | Song | G01R 31/2882 716/114 |

FOREIGN PATENT DOCUMENTS

| | | |
|---|---|---|
| CN | 104051003 A | 9/2014 |
| WO | 0225334 A1 | 3/2002 |
| WO | 03/083872 A2 | 10/2003 |

* cited by examiner

SEMICONDUCTOR DEVICE FOR SELECTIVELY PERFORMING ISOLATION FUNCTION AND LAYOUT DISPLACEMENT METHOD THEREOF

CROSS-REFERENCE TO RELATED APPLICATIONS

This is a continuation application of U.S. patent application Ser. No. 16/566,002, filed Sep. 10, 2019, which is a divisional application of U.S. patent application Ser. No. 15/417,807, filed Jan. 27, 2017, now U.S. Pat. No. 10,453,521, issued Oct. 22, 2019, in the U.S. Patent and Trademark Office, which claims priority from U.S. Provisional Patent Application No. 62/288,750 filed on Jan. 29, 2016, in the U.S. Patent and Trademark Office, and from Korean Patent Application No. 10-2016-0058860 filed May 13, 2016, in the Korean Intellectual Property Office, the discloses of which are incorporated herein by reference in their entireties.

BACKGROUND

1. Field

Apparatuses consistent with example embodiments relate to a semiconductor device, and more particularly, relate to a layout of a semiconductor device that selectively operates as an insulating circuit or a driving circuit.

2. Description of Related Art

A semiconductor device is gradually shrunk in size as the semiconductor device is highly integrated and the storage capacity thereof increases. Accordingly, resolution of a semiconductor manufacturing process is increasing. However, the increased resolution of the semiconductor fabricating process causes a decrease in a distance between gate electrodes of the semiconductor device. In this case, an unintended short circuit or product defect also increases. For this reason, electrical insulation is also emerging as an issue.

In general, an insulating film produced by a separate process, such as a shallow trench isolation (STI) process, may be used for insulation of the semiconductor device. Alternatively, a method of increasing the distance between the gate electrodes or inserting a dummy gate may be used for insulation of the semiconductor device. However, such methods are inefficient because a chip size of the semiconductor device is increased and an additional/extra process is performed.

SUMMARY

According to example embodiments, a system on chip includes a first semiconductor device including a first transistor and a second transistor, the first transistor and the second transistor including a first gate electrode and a second gate electrode, respectively, the first semiconductor device being disposed on an active area disposed on a substrate, the active area extending in a first direction, and the first gate electrode and the second gate electrode extending in a second direction different from the first direction and disposed along the first direction. The system on chip further includes a second semiconductor device including a third transistor and a fourth transistor, the third transistor and the fourth transistor including a third gate electrode and a fourth gate electrode, respectively, the second semiconductor device being disposed on the active area, and the third gate electrode and the fourth gate electrode extending in the second direction and disposed along the first direction. In response to the first transistor, the third transistor, and the fourth transistor being turned on, the second transistor is configured to turn off to electrically insulate the first transistor from a device adjacent to the first transistor.

According to example embodiments, a semiconductor device includes an active area disposed on a substrate and extending in a first direction, and a first transistor including a first gate electrode and first source and drain areas disposed on the active area, the first source and drain areas being disposed at opposite sides of the first gate electrode. The semiconductor device further includes a second transistor including a second gate electrode and second source and drain areas disposed on the active area, the second source and drain areas being disposed at opposite sides of the second gate electrode, and a third transistor including a third gate electrode and third source and drain areas disposed on the active area, the third source and drain areas being disposed at opposite sides of the third gate electrode, and the first gate electrode, the second gate electrode, and the third gate electrode extending in a second direction different from the first direction and disposed along the first direction. The second transistor is configured to turn on and off, based on an operation mode of the semiconductor device.

According to example embodiments, a semiconductor device includes a first active area and a second active area extending in a first direction and disposed on a substrate along a second direction different from the first direction, and a first transistor including a first gate electrode and first source and drain areas, the first gate electrode being disposed on the first active area and the second active area and extending in the second direction, and the first source and drain areas being disposed on the first active area and disposed at opposite sides of the first gate electrode. The semiconductor device further includes a second transistor including a second gate electrode and second source and drain areas, the second gate electrode being disposed on the first active area and extending in the second direction, and the second source and drain areas being disposed on the first active area and disposed at opposite sides of the second gate electrode, and a third transistor including the first gate electrode and third source and drain areas, the third source and drain areas being disposed on the second active area and disposed at opposite sides of the first gate electrode. The semiconductor device further includes a fourth transistor including a third gate electrode and fourth source and drain areas, the third gate electrode being disposed on the second active area and extending in the second direction, and the fourth source and drain areas being disposed on the second active area and disposed at opposite sides of the third gate electrode. A source or drain area that is shared by the first transistor and the second transistor, among the first source and drain areas and the second source and drain areas, is connected to a source or drain area that is shared by the third transistor and the fourth transistor, among the third source and drain areas and the fourth source and drain areas, and the second transistor and the fourth transistor are configured to turn on and off.

According to example embodiments, a semiconductor device includes a first active area and a second active area extending in a first direction and disposed on a substrate along a second direction different from the first direction, and a first transistor including a first gate electrode and first source and drain areas, the first gate electrode being disposed on the first active area and the second active area and extending in the second direction, and the first source and drain areas being disposed on the first active area and disposed at opposite sides of the first gate electrode. The semiconductor device further includes a second transistor including a second gate electrode and second source and drain areas, the second gate electrode being disposed on the first active area and the second active area and extending in the second direction, and the second source and drain areas being disposed on the first active area and disposed at opposite sides of the second gate electrode, and a third transistor including the first gate electrode and third source and drain areas, the third source and drain areas being disposed on the second active area and disposed at opposite sides of the first gate electrode. The semiconductor device further includes a fourth transistor including the second gate electrode and fourth source and drain areas, the fourth source and drain areas being disposed on the second active area and disposed at opposite sides of the second gate electrode. A source or drain area that is shared by the first transistor and the second transistor, among the first source and drain areas and the second source and drain areas, is connected to a source or drain area that is shared by the third transistor and the fourth transistor, among the third source and drain areas and the fourth source and drain areas.

DETAILED DESCRIPTION

Figure 1:
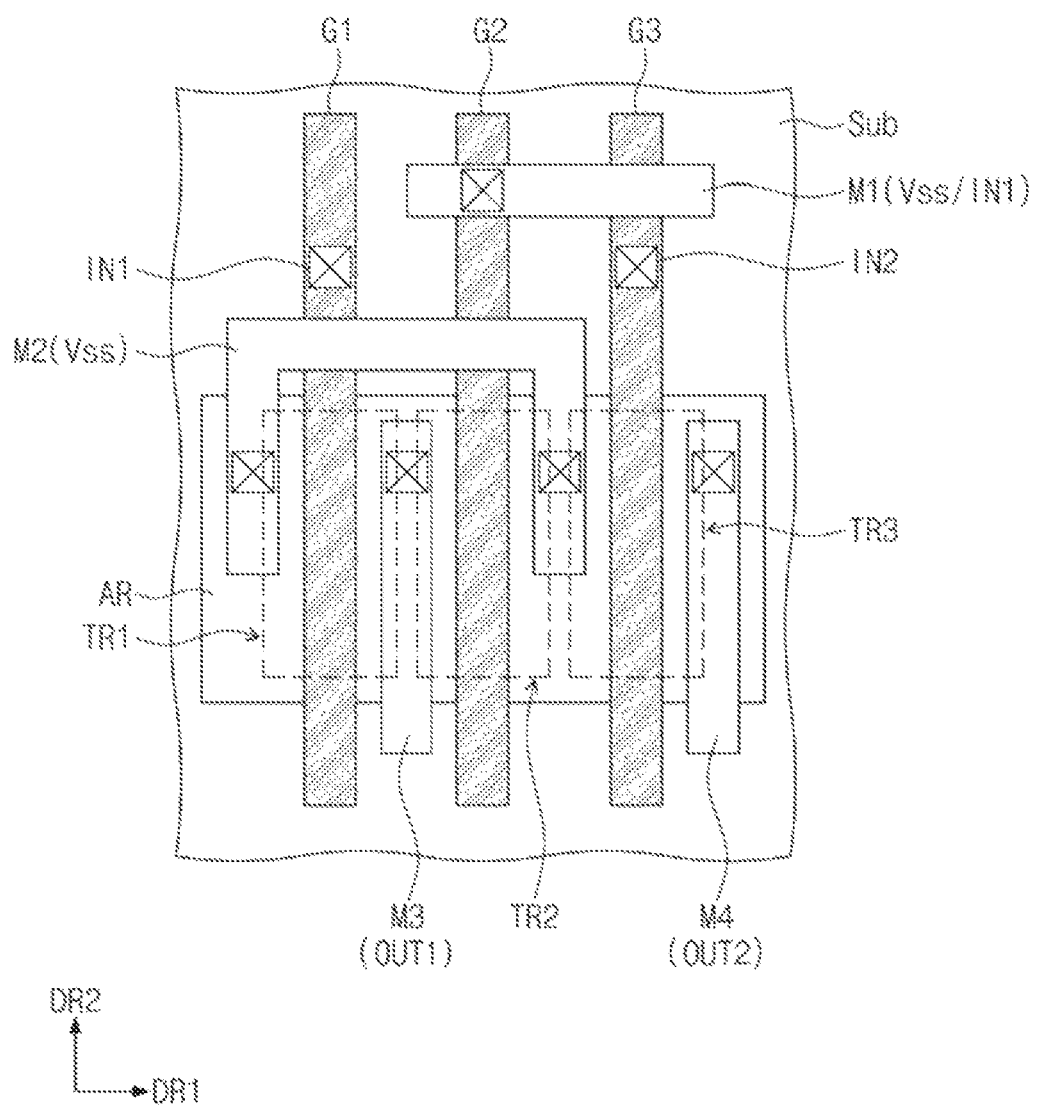
FIG. 1 is a plan view illustrating a layout of a semiconductor device according to example embodiments.
Figure 2:
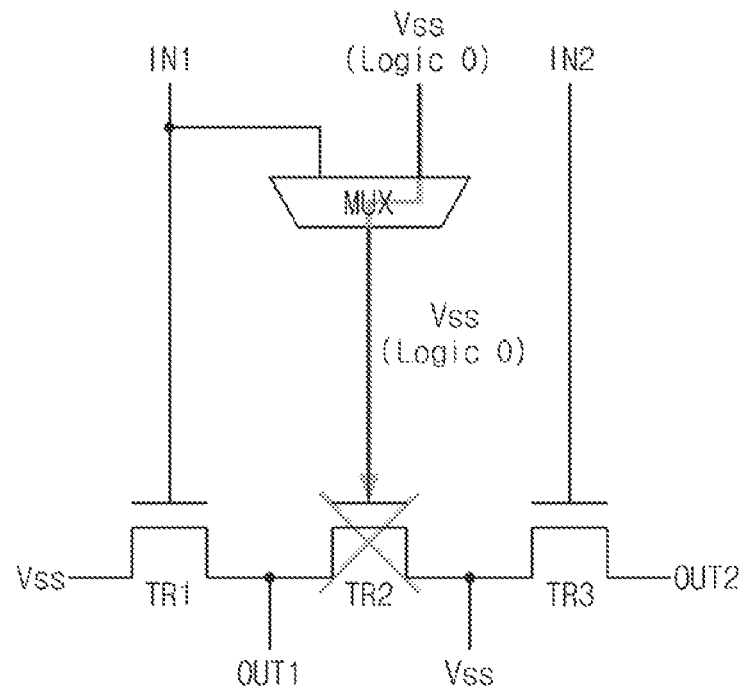
FIG. 2 is a circuit diagram of a semiconductor device at a first operating mode, according to example embodiments.
Figure 3:
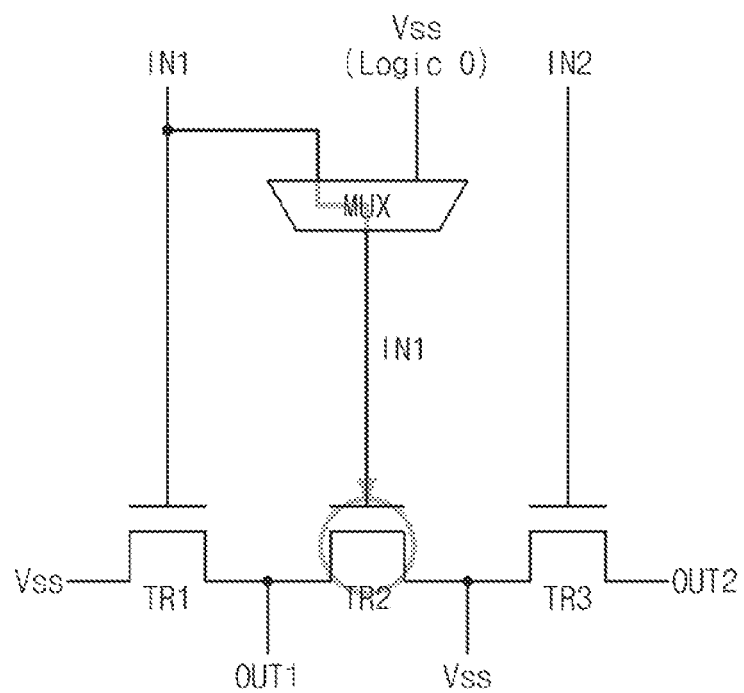
FIG. 3 is a circuit diagram of a semiconductor device at a second operating mode, according to example embodiments.

FIG. 1 is a plan view illustrating a layout of a semiconductor device according to example embodiments. FIG. 2 is a circuit diagram of a semiconductor device at a first operating mode, according to example embodiments. FIG. 3 is a circuit diagram of a semiconductor device at a second operating mode, according to example embodiments.

Referring to FIG. 1, an active region AR may be formed on a substrate Sub. The active region AR may include source and drain areas and channel areas constituting a transistor. For example, the substrate Sub may be a silicon substrate, a germanium substrate, or a silicon on insulator (SOI) substrate.

First to third transistors TR1 to TR3 may be formed on the active region AR. For example, the active region AR may be formed to extend in a first direction DR1. For example, each of the first to third transistors TR1 to TR3 may be a PMOS or NMOS field effect transistor (FET). In FIG. 1, for descriptive convenience, it is assumed that the active region AR is an NMOS area, and each of the first to third transistors TR1 to TR3 is an NMOS FET.

The first to third transistors TR1 to TR3 may include respective gate electrodes G1 to G3 that are formed to extend in a second direction DR2, and each of the first to third transistors TR1 to TR3 may include source and drain areas that are formed on active areas AR and arranged at opposite sides at each of the gate electrodes, and a channel area. As illustrated in FIG. 1, the first to third transistors TR1 to TR3 may be serially connected to each other. That is, the first and second transistors TR1 and TR2 may share a source or drain area, and the second and third transistors TR2 and TR3 may share a source or drain area.

A first input voltage IN1 may be provided to a first gate electrode G1. The first input voltage IN1 or a ground voltage $V_{SS}$ may be selectively provided to a second gate electrode G2. For example, the first input voltage IN1 or ground voltage $V_{SS}$ may be provided through a first conductive line M1. Furthermore, a second input voltage IN2 may be applied to a third gate electrode G3. For example, the first and second input voltages IN1 and IN2 may be a voltage for turning on each of the first and third transistors TR1 and TR3. For example, the ground voltage $V_{SS}$ may be an insufficient voltage for turning on the second transistor TR2. Although it is explained that the ground voltage $V_{SS}$ is used, some voltage, which is not insufficient to turn on the second transistor TR2, other than the ground voltage $V_{SS}$ may be used.

As illustrated in FIGS. 1 and 2, the ground voltage $V_{SS}$ may be applied to a source or drain area of the first transistor TR1, and the ground voltage $V_{SS}$ may be applied to a source or drain area that is shared by the second and third transistors TR2 and TR3. To apply the ground voltage $V_{SS}$, a second conductive line M2 may be arranged as illustrated in FIG. 1. However, a conductive line for providing the ground voltage $V_{SS}$ may be limited thereto.

An output OUT1 from a source or drain area that is shared by the first and second transistors TR1 and TR2 may be output through a third conductive line M3. In addition, an output OUT2 from another source or drain area of the third transistor TR3 may be output through a fourth conductive line M4.

Because the second transistor TR2 is selectively turned on or off according to a voltage (or signal) inputted to the second gate electrode G2, a function of the second transistor TR2 may be changed. For example, when the second transistor TR2 is turned off by applying the ground voltage $V_{SS}$ to the second gate electrode G2, the second transistor TR2 may serve as an isolator in which the first and third transistors TR1 and TR3 are electrically insulated from each other. In contrast, when the second transistor TR2 is turned on by applying a first input voltage IN1 to the second gate electrode G2, the second transistor TR2 may serve as a driver for improving a driving force of the semiconductor device.

For example, a multiplexer MUX illustrated in FIGS. 2 and 3 may be selectively used to perform as one of the insulator and the driver. Referring to FIGS. 1 and 2, during a first operation mode, a multiplexer MUX may select the ground voltage $V_{SS}$ as a voltage that is applied to a second gate electrode G2. As a result, because the second transistor TR2 is turned off, the second transistor TR2 may serve as an isolator for electrically insulating the first and second transistors TR1 and TR2 from each other. For example, the multiplexer MUX may be controlled by a separate control signal.

Furthermore, referring to FIGS. 1 and 3, during a second operation mode, the multiplexer MUX may select the first input voltage IN1 (e.g., a power voltage) as a voltage that is applied to the second gate electrode G2. As a result, the second transistor TR2 is turned on, and thus the second transistor TR2 may serve as a driver for improving a driving force of the semiconductor device. In the example embodiments of FIGS. 1, 2, and 3, the first operation mode and the second operation mode are selectively executed through the multiplexer MUX. However, according to example embodiments, in a semiconductor device, a circuit for performing the first operation mode and a circuit for performing the second operation mode may be implemented at the same time. This will be described with reference to FIG. 4.

Figure 4:
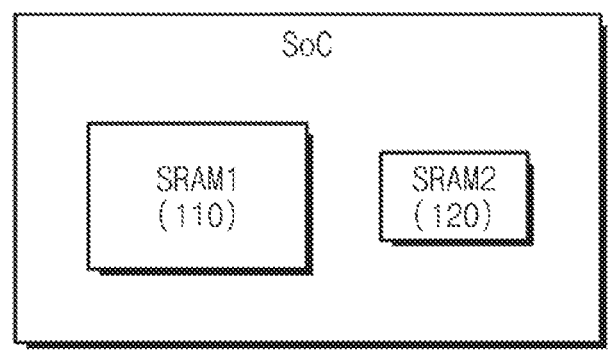
FIG. 4 is a block diagram illustrating a System on Chip (SOC) according to example embodiments.

FIG. 4 is a block diagram illustrating a System on Chip (SOC) according to example embodiments. Referring to FIG. 4, an SOC 100 may include a first static random access memory (SRAM) 110 and a second SRAM 120.

The first SRAM 110 and the second SRAM 120 may perform substantially the same function as each other. However, a size of the first SRAM 110 is greater than that of the second SRAM 120. In more detail, the number of bit lines connected to a sense amplifier circuit of the first SRAM 110 is greater than the number of bit lines connected to a sense amplifier circuit of the second SRAM 120.

For example, as described above, the first SRAM 110 may include a semiconductor device that performs a function (e.g., an insulating layer function) at the first operation mode described with reference to FIGS. 1 and 2. In contrast, the second SRAM 120 may include a semiconductor device that performs a function (e.g., a driver function) at the second operation mode described with reference to FIGS. 1 and 3.

As such, even though the first SRAM 120 performs the same function as the second SRAM 110, the first and second SRAMs 110 and 120 may perform different operation modes based on the size and usage thereof, respectively, thereby improving an insulating function and driving force of the SRAMs.

Figure 5:
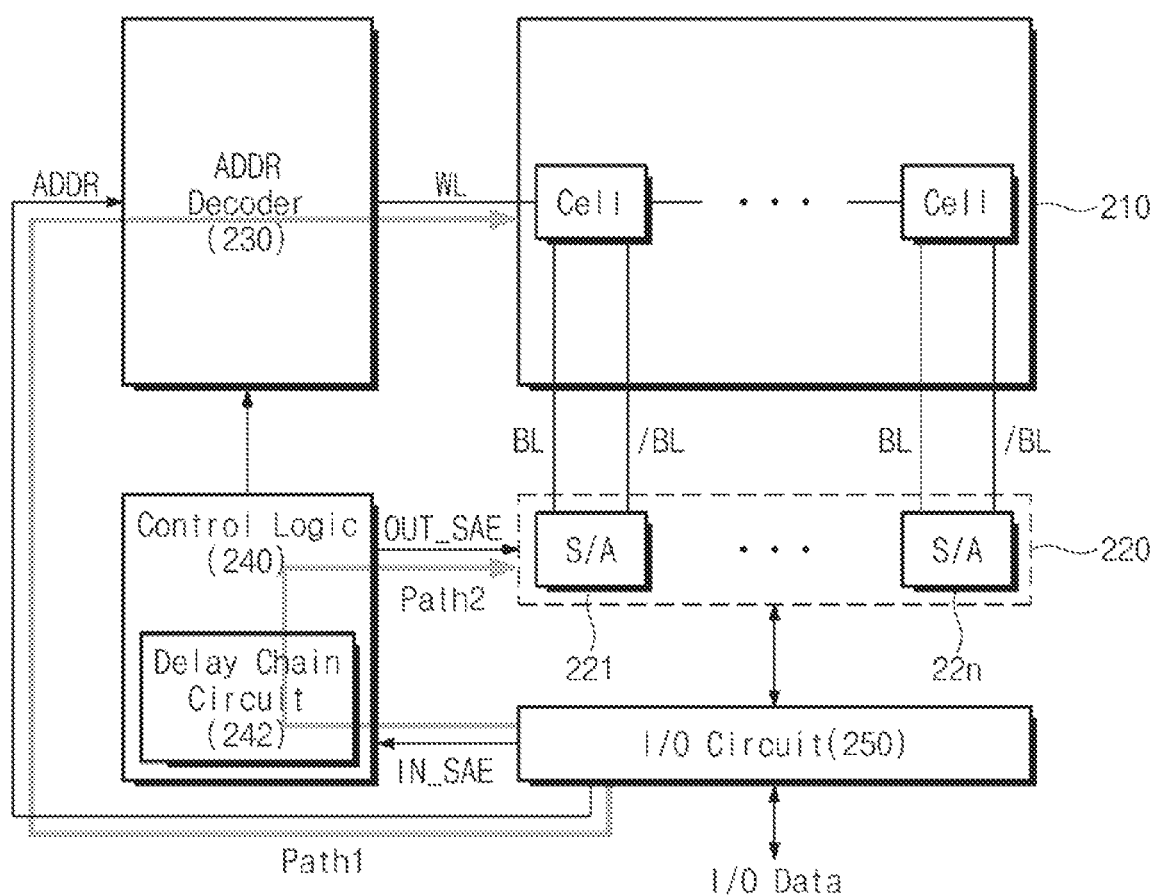
FIG. 5 is a block diagram illustrating one of first and second static random access memories (SRAMs) illustrated in FIG. 4.

FIG. 5 is a block diagram illustrating one of the first SRAM 110 and the second SRAM 120 illustrated in FIG. 4. Referring to FIG. 5, an SRAM 200 may include an SRAM cell array 210, a sense amplifier circuit 220, an address (ADDR) decoder 230, control logic 240, and an input/output (I/O) circuit 250.

The SRAM cell array 210 may include SRAM cells connected to a plurality of bit lines BL and a plurality of word lines WL. Each of the SRAM cells may be accessed through a word line and a bit line. Each of the SRAM cells may be connected to a bit line pair BL and/BL based on a word line voltage. Each of the SRAM cells may include a latch circuit, and pass transistors that receive the word line voltage as a gate voltage. During a sensing operation, voltages of the bit line pair BL and/BL that is precharged according to data stored in a latch circuit may vary. The data may be sensed by sensing the varied voltage.

The sense amplifier circuit 220 may include a plurality of sense amplifiers (S/A) 221 to 22n. The bit line pair BL and/BL may be connected to each of the sense amplifiers. During a sensing operation, each of the sense amplifiers may sense data by sensing voltage fluctuations of the bit line pair BL and/BL.

The address decoder 230 may decode an address ADDR, which is received from an external device, to select any one or any combination of a plurality of word lines WL.

The control logic 240 may control an overall operation of the SRAM 200. For example, the control logic 240 may send a sense amplifier enable signal SAE, which is received from the input/output circuit 250, to the sense amplifier circuit 220. For example, the control logic 240 may include a delay chain circuit 242 that delays a sense amplifier enable signal IN_SAE received from the input/output circuit 250 to output the delayed sense amplifier enable signal OUT_SAE.

The input/output circuit 250 may exchange input/output (I/O) data (e.g., write data or read data) with the external device (e.g., a controller). The input/output circuit 250 may send an address, which is received from the external device, to the address decoder 230. The input/output circuit 250 may send the sense amplifier enable signal SAE, which is received from the external device, to the control logic 240.

Referring to FIG. 5, during a read operation of the SRAM 200, a word line WL of the SRAM cell array 210 may be activated by the address decoder 230, and one of the bit line pair BL and/BL based on data stored in an SRAM cell may be discharged. Thereafter, when the sense amplifier circuit 220 is activated by the sense amplifier enable signal SAE, a voltage difference between a bit line pair BL and/BL may be amplified by the sense amplifier circuit 220. That is, there may be a sufficient term between a point in time when the word line WL of the SRAM cell array 210 is activated and a point in time when the sense amplifier circuit 220 is activated by the sense amplifier enable signal SAE. Hereinafter, this term may be referred to as "WL-to-SAE term."

Figure 6:
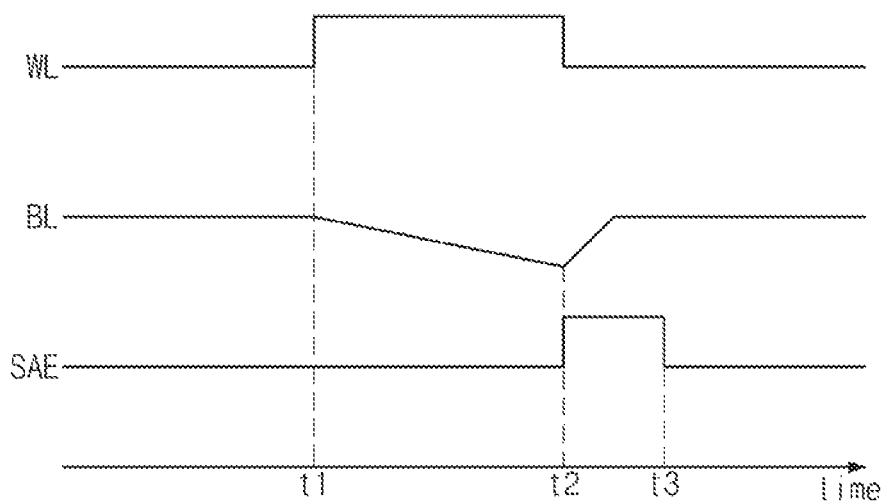
FIG. 6 is a view illustrating waveforms of signals during a read operation at the first SRAM illustrated in FIG. 4.
Figure 7:
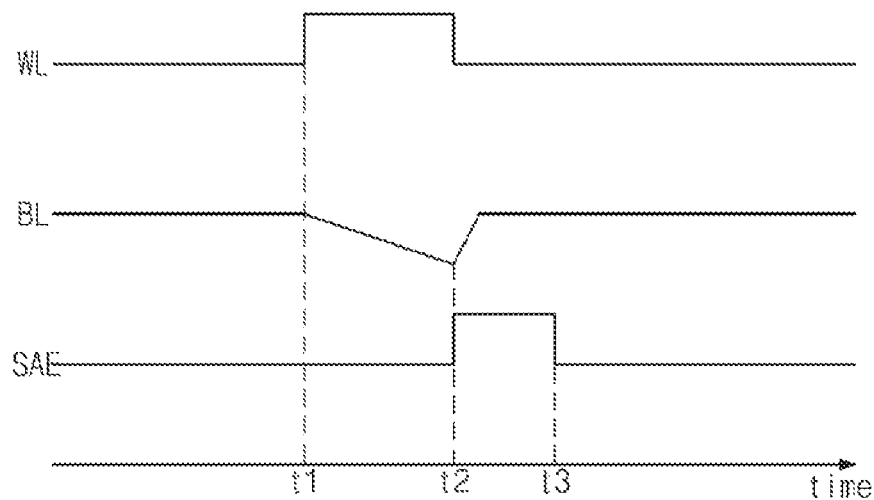
FIG. 7 is a view illustrating waveforms of signals during a read operation at the first SRAM illustrated in FIG. 4.

FIG. 6 is a view illustrating waveforms of signals during a read operation of the first SRAM 110 illustrated in FIG. 4. FIG. 7 is a view illustrating waveforms of signals during a read operation of the second SRAM 120 illustrated in FIG. 4. Referring to FIGS. 6 and 7, discharging of a bit line BL begins at a point in time t1 when activation of the word line WL begins. In addition, the sense amplifier enable signal SAE is activated at a point in time when the activation of the word line WL ends. That is, the sense amplifier enable signal SAE is activated at a point in time t2 when the bit line BL is sufficiently discharged.

A read operation of the first SRAM 110 will be described with reference to FIGS. 4, 5 and 6. In the first SRAM 110 that has a relatively large size, the WL-to-SAE term t1 to t3 may be relatively long. In more detail, the WL-to-SAE term may become longer as the number of SRAM cells, which are connected to a bit line pair BL and/BL connected to each of the sense amplifiers S/A of the sense amplifier circuit 220, increases. The reason is that a relatively long time is used to discharge the SRAM cells during a read operation of the SRAM 200. To perform this function, a delay chain circuit 242 is used to increase a delay amount of the sense amplifier enable signal SAE.

A read operation of the first SRAM 120 will be described with reference with FIGS. 4, 5, and 7. In the second SRAM 120 that has a relatively small size, the WL-to-SAE term t1 to t3 may be relatively short. In more detail, the WL-to-SAE term may become shorter as the number of SRAM cells, which are connected to a bit line pair BL and/BL connected to each of the sense amplifiers S/A of the sense amplifier circuit 220, decreases. The reason is that a relatively short time is used to discharge the SRAM cells during a read operation of the SRAM 200. To perform this function, the delay chain circuit 242 is used to decrease a delay amount of the sense amplifier enable signal SAE.

As described above, the WL-to-SAE term may vary according to a configuration of the SRAM (e.g., the number of SRAM cells connected to a bit line). Accordingly, the semiconductor device described with reference with FIGS. 1 to 3 may be used to implement the delay chain circuits 242 that adjust the WL-to-SAE term in consideration of the configuration of the SRAM. This will be described in more detail with reference to FIGS. 8 to 15.

Figure 8:
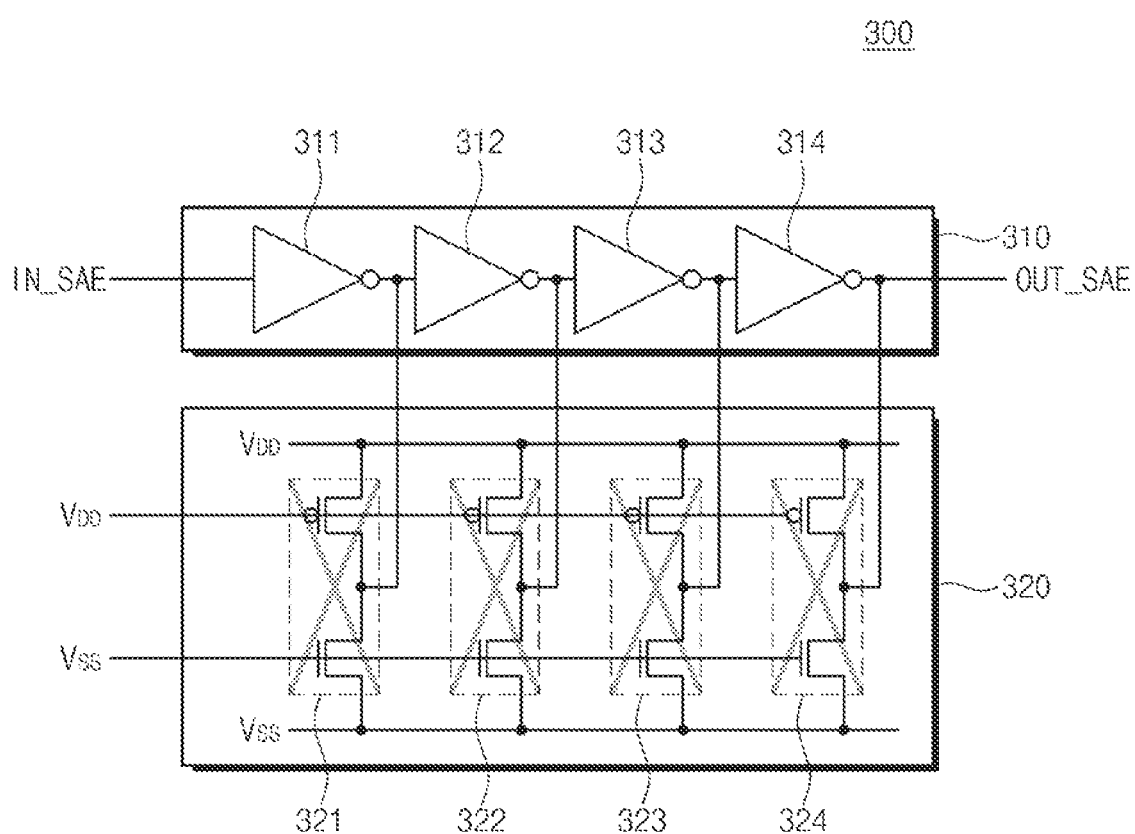
FIG. 8 is a detailed circuit diagram of a delay chain circuit of FIG. 5.

FIG. 8 is a detailed circuit diagram of the delay chain circuit 242 of FIG. 5. For example, a delay chain circuit 300 illustrated in FIG. 8 may be the first SRAM 110 of a relatively large size illustrated in FIG. 4. To help understanding, example embodiments will be described with reference to FIGS. 5, 6, and 8.

The delay chain circuit 300 may include a delay chain block 310 and an isolation circuit 320. The delay chain block 310 may include a plurality of inverters 311 to 314 serially connected to each other. In example embodiments, the delay chain block 310 includes four inverters. However, example embodiments may be not limited thereto. The isolation circuit 320 may include a plurality of isolators 321 to 324. Likewise, in example embodiments, the isolation circuit 320 includes four isolators. However, example embodiments may be not limited thereto.

The delay chain block 310 may receive an input signal to output the delayed input signal. For example, the delay chain block 310 may receive a sense amplifier enable signal IN_SAE from the input/output circuit 250 to output a delayed sense amplifier enable signal OUT_SAE. For example, the sense amplifier enable signal IN_SAE may be delayed by (t2−t1) through the delay chain block 310. For example, each of the inverters constituting the delay chain block 310 may be implemented with a PMOS transistor and an NMOS transistor. However, configuration of the delay chain block 310 may be not limited thereto.

Each of the isolators constituting the isolation circuit 320 may be implemented with a PMOS transistor and an NMOS transistor. For example, the isolators may be connected to the inverters, respectively. For example, an output terminal of a first isolator 321 may be connected to an output terminal of a first inverter 311. An output terminal of a second isolator 322 may be connected to an output terminal of a second inverter 312. Output terminals of third and fourth isolators 323 and 324 may be also connected in a manner similar to those of the first and second isolators, respectively.

A power supply voltage $V_{DD}$ may be applied to one end of each of the PMOS transistors constituting the isolation circuit 320, and a ground voltage $V_{SS}$ may be applied to one end of each of the NMOS transistors constituting the isolation circuit 320. Furthermore, the power supply voltage $V_{DD}$ may be applied to a gate terminal of each of the PMOS transistors constituting the isolation circuit 320, and the ground voltage $V_{SS}$ may be applied to a gate terminal of each of the NMOS transistors constituting the isolation circuit 320. As a result, the PMOS and NMOS transistors constituting the isolation circuit 320 may be turned off, and thus the isolation circuit 320 may electrically insulate the delay chain block 310 from other circuits adjacent to the delay chain block 310.

Figure 9:
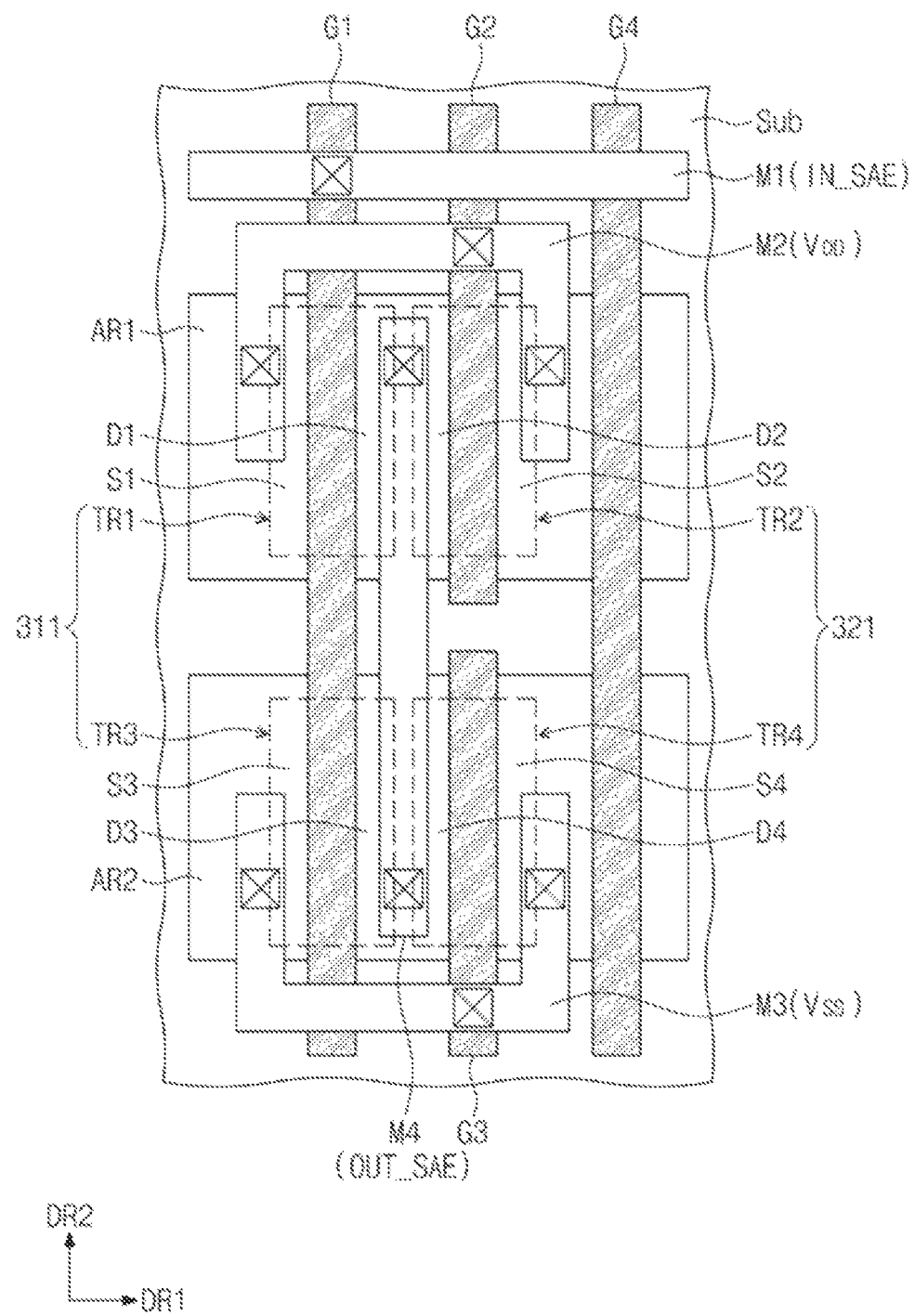
FIG. 9 is a plan view illustrating a portion of a layout of the delay chain circuit illustrated in FIG. 8.

FIG. 9 is a plan view illustrating a portion of a layout of the delay chain circuit 300 illustrated in FIG. 8. In example embodiments, a layout of the first inverter 311 and the first isolator 321 of the delay chain circuit 300 is illustrated in FIG. 9.

To help understanding, referring to FIGS. 8 and 9, a first active region AR1 and a second active region AR2 may be formed on a substrate. For example, the first active region AR1 and the second active region AR2 may extend in a first direction DR1 and may be arranged along a second direction DR2 perpendicular to the first direction DR1. Each of the first and second active regions AR1 and AR2 may include source and drain areas and channel areas for forming respective transistors. For example, the substrate Sub may be a silicon substrate, a germanium substrate, or a silicon on insulator (SOI) substrate.

The first and second transistors TR1 and TR2 may be formed on the first active region AR1. For example, each of the first and second transistors TR1 and TR2 may be a PMOS FET.

The first and second transistors TR1 and TR2 may include respective gate electrodes G1 and G2 formed to extend in the second direction DR2, and each of the first and second transistors TR1 and TR2 may include source areas S1 and S2 and drain areas D1 and D2 formed on the first active region AR1 and arranged at opposite sides of each of the gate electrodes G1 and G2, and a channel area. As illustrated in FIG. 9, the first and second transistors TR1 and TR2 may be serially connected to each other. That is, the first and second transistors TR1 and TR2 may share a source or drain area.

The third and fourth transistors TR3 and TR4 may be formed on the second active region AR2. For example, each of the third and fourth transistors TR3 and TR4 may be an NMOS FET.

The third and fourth transistors TR3 and TR4 may include respective gate electrodes G1 and G3 formed to extend in the second direction DR2, and each of the third and fourth transistors TR3 and TR4 may include source areas S3 and S4 and drain areas D3 and D4 formed on the second active region AR2 and arranged at opposite sides of each of the gate electrodes G1 and G3, and a channel area. That is, the second and fourth transistors TR2 and TR4 may not share a gate electrode (e.g., the second gate electrode G2). As illustrated in FIG. 9, the third to fourth transistors TR3 to TR4 may be serially connected to each other. That is, the third and fourth transistors TR3 and TR4 may share a source or drain area.

The sense amplifier enable signal IN_SAE may be applied to the first gate electrode G1. The power supply voltage $V_{DD}$ may be applied to the second gate electrode G2. In addition, the ground voltage $V_{SS}$ may be applied to the third gate electrode G3. For example, the sense amplifier enable signal IN_SAE may be applied to the first gate electrode G1 through a first conductive line M1. For example, the power supply voltage $V_{DD}$ may be applied to the second gate electrode G2 through a second conductive line M2. For example, the ground voltage $V_{SS}$ may be applied to the third gate electrode G3 through a third conductive line M3. For example, the ground voltage $V_{SS}$ may be a voltage insufficient to turn on the third transistor TR3. However, some voltage, which is not insufficient to turn on the third transistor TR3, other than the ground voltage $V_{SS}$ may be used.

The power supply voltage $V_{DD}$ may be applied to the source or drain area of the first transistor TR1, and the power supply voltage $V_{DD}$ may be applied to the source or drain area of the second transistor TR2. The ground voltage $V_{SS}$ may be applied to the source or drain area of the third transistor TR3, and the ground voltage $V_{SS}$ may be applied to the source or drain area of the fourth transistor TR4.

For example, the power supply voltage $V_{DD}$ may be applied to the first and second transistors TR1 and TR2 through the second conductive line M2. For example, the ground voltage $V_{SS}$ may be applied to the third and fourth transistors TR3 and TR4 through a third conductive line M3. However, the configuration for applying the power supply voltage $V_{DD}$ and the ground voltage $V_{SS}$ is not limited thereto.

The output signal OUT_SAE from the source or drain area, which is shared by the first and second transistors TR1 and TR2, may be output through a fourth conductive line M4. The output signal OUT_SAE from the source or drain area, which is shared by the third and fourth transistors TR3 and TR4, may be output through the fourth conductive line M4. However, in example embodiments, the first isolator 321, which is composed of the second and fourth transistors TR2 and TR4, may remain at a turn-off state. Accordingly, a signal, which is output through the fourth conductive line M4, may be a signal that is output from the first inverter 311 composed of the first and third transistors TR1 and TR3.

According to the layout and bias condition described with reference to FIG. 9, the first isolator 321, which is composed of the second and fourth transistors TR2 and TR4, may electrically insulate the first inverter 311 from another device. For example, the first isolator 321 may electrically insulate the first inverter 311 from a transistor including a fourth gate electrode G4.

The delay chain circuit 300 may be implemented as illustrated in FIG. 8 by appropriately placing the layout illustrated in FIG. 9. Because outputs of the first inverter 311 and the first isolator 321 are used as an input of the second inverter 312, an appropriate conductive line for such a configuration may be used, and a detailed description thereof will not be repeated here.

According to the delay chain circuit 300 implemented by using the layout illustrated in FIG. 9, there is no need to place a separate device for electrical isolation, and there is no need to increase a distance between gate electrodes. An insulation device may be implemented by using a placement of a layout and adjusting a bias condition, thereby improving area efficiency and insulating performance.

Figure 10:
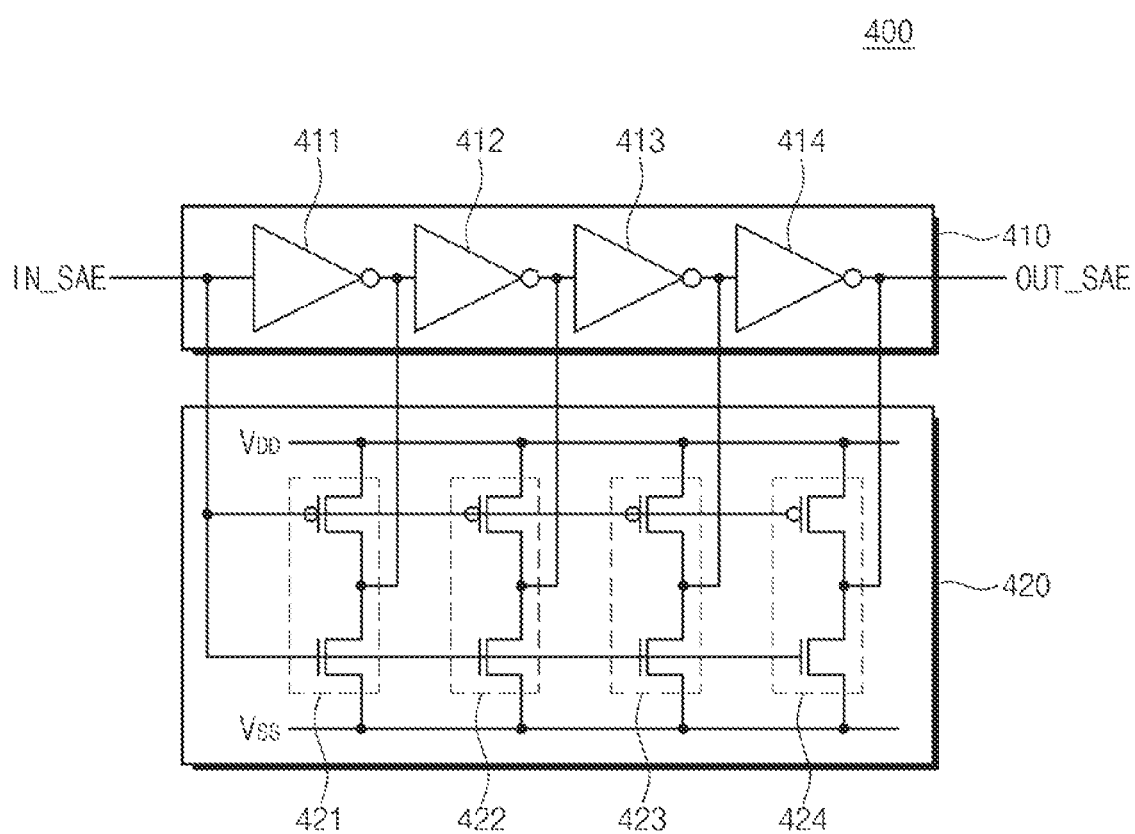
FIG. 10 is a detailed circuit diagram of the delay chain circuit of FIG. 5.

FIG. 10 is a detailed circuit diagram of the delay chain circuit 242 of FIG. 5. For example, a delay chain circuit 400 illustrated in FIG. 10 may be the first SRAM 120 of a relatively small size illustrated in FIG. 4. To help understanding, example embodiments will be described with reference to FIGS. 5, 7, and 10.

The delay chain circuit 400 may include a delay chain block 410 and a driving circuit 420. The delay chain block 410 may include a plurality of inverters 411 to 414 serially connected to each other. In example embodiments, the delay chain block 410 includes four inverters. However, example embodiments are not limited thereto. The driving circuit 420 may include a plurality of drivers 421 to 424. Likewise, in example embodiments, the driving circuit 420 includes four drivers. However, example embodiments are not limited thereto.

The delay chain block 410 may receive an input signal to output a delayed input signal. For example, the delay chain block 410 may receive the sense amplifier enable signal IN_SAE to output the delayed sense amplifier enable signal OUT_SAE. For example, the sense amplifier enable signal IN_SAE may be delayed by (t2−t1) through the delay chain block 410. However, a delay time of the delay chain block 410 may be shorter than that of the delay chain block 310 (refer to FIG. 8). For example, each of the inverters constituting the delay chain block 410 may be implemented with PMOS and NMOS transistors.

Each of the drivers constituting the driving circuit 420 may be implemented with the PMOS and NMOS transistors. For example, the drivers may be connected in parallel to the inverters, respectively. For example, input and output terminals of a first driver 421 may be connected to input and output terminals of a first driver 411, respectively. Input and output terminals of second to fourth drivers 422 to 424 may be also connected in a manner similar to those of the first driver 411.

Figure 11:
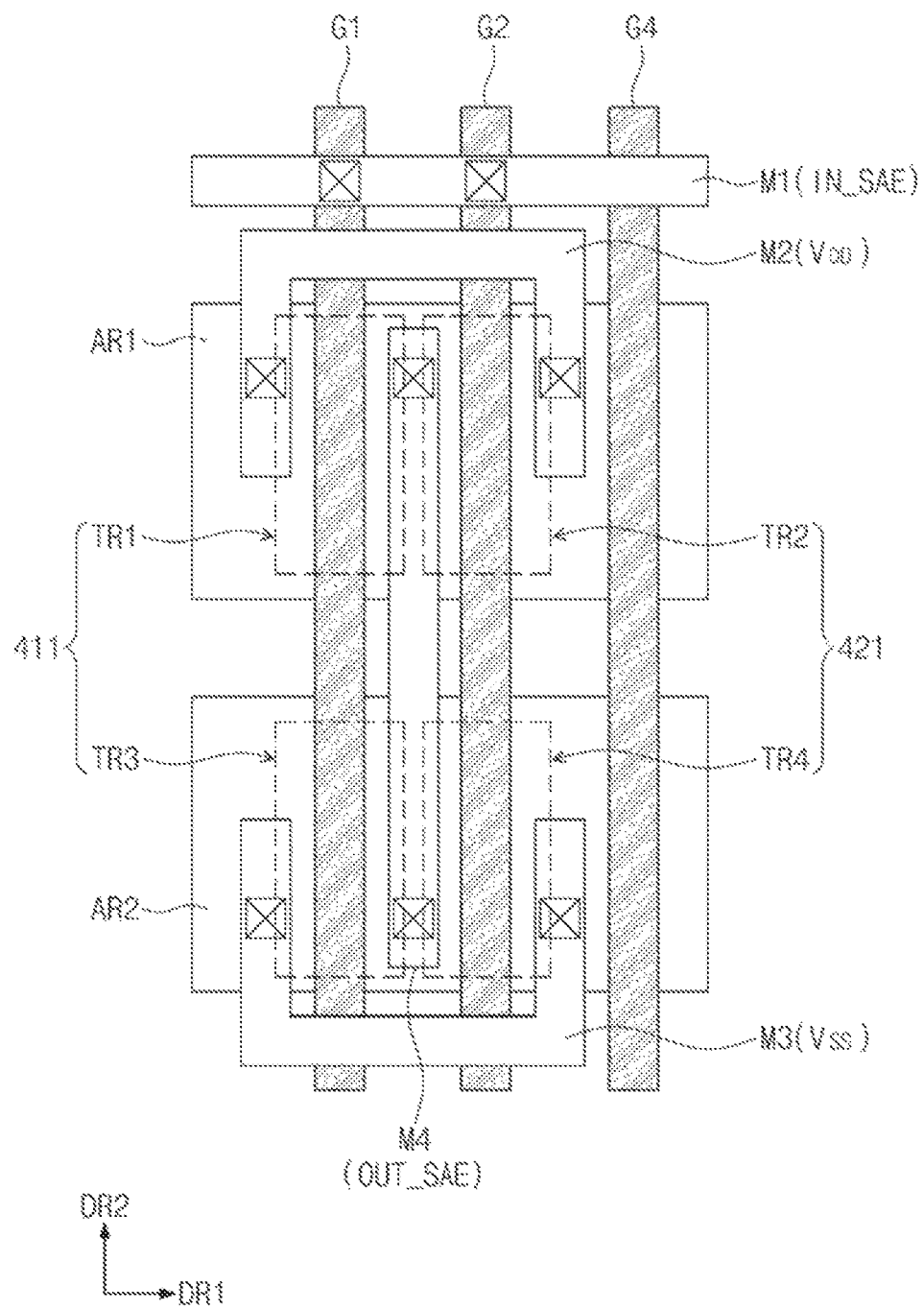
FIG. 11 is a plan view illustrating a portion of a layout of the delay chain circuit illustrated in FIG. 10.

The power supply voltage $V_{DD}$ may be applied to the input terminals of the inverters constituting the driving circuit 420. As a result, the driving circuit 420 may improve driving ability of the delay chain block 410. That is, a delay time of the delay chain block 410 may become relatively short FIG. 11 is a plan view illustrating a portion of a layout of the delay chain circuit 400 illustrated in FIG. 10. In example embodiments, a layout of the first inverter 411 and the first driver 421 of the delay chain circuit 400 is illustrated in FIG. 11.

To help understanding, referring to FIGS. 10 and 11, first and second active regions AR1 and AR2 may be formed on a substrate. Each of the first and second active regions AR1 and AR2 may include source and drain areas, and a channel area for forming a transistor. For example, the substrate Sub may be a silicon substrate, a germanium substrate, or a silicon on insulator (SOI) substrate.

The first and second transistors TR1 and TR2 may be formed on the first active region AR1. For example, each of the first and second transistors TR1 and TR2 may be a PMOS FET.

The first and second transistors TR1 and TR2 may include respective gate electrodes G1 and G2 formed to extend in the second direction DR2, and each of the first and second transistors TR1 and TR2 may include source and drain areas formed on the first active region AR1 and arranged at opposite sides of each of the gate electrodes G1 and G2, and channel areas. As illustrated in FIG. 11, the first and second transistors TR1 and TR2 may be serially connected to each other. That is, the first and second transistors TR1 and TR2 may share a source or drain area.

The third and fourth transistors TR3 and TR4 may be formed on the second active region AR2. For example, each of the third and fourth transistors TR3 and TR4 may be an NMOS FET.

The third and fourth transistors TR3 and TR4 may include the respective gate electrodes G1 and G2 formed to extend in the second direction DR2, and each of the third and fourth transistors TR3 and TR4 may include source and drain areas formed on the second active region AR2 and arranged at opposite sides of each of the gate electrodes G1 and G2, and channel areas. As illustrated in FIG. 11, the third and fourth transistors TR3 and TR4 may be serially connected to each other. That is, the third transistor TR3 may share the gate electrode G1 with the first transistor TR1, and the fourth transistor TR4 may share the gate electrode G2 with the second transistor TR2. Furthermore, the third and fourth transistors TR3 and TR4 may share a source or drain area.

The sense amplifier enable signal IN_SAE may be applied to the first and second gate electrodes G1 and G2. For example, the sense amplifier enable signal IN_SAE may be applied to the first and second gate electrodes G1 and G2 through a first conductive line M1.

The power supply voltage $V_{DD}$ may be applied to the source or drain area of the first transistor TR1, and the power supply voltage $V_{DD}$ may be applied to the source or drain area of the second transistor TR2. The ground voltage $V_{SS}$ may be applied to the source or drain area of the third transistor TR3, and the ground voltage $V_{SS}$ may be applied to the source or drain area of the fourth transistor TR4.

For example, the power supply voltage $V_{DD}$ may be applied to the first and second transistors TR1 and TR2 through the second conductive line M2. For example, the ground voltage $V_{SS}$ may be applied to the third and fourth transistors TR3 and TR4 through a third conductive line M3. However, the configuration for applying the power supply voltage $V_{DD}$ and the ground voltage $V_{SS}$ is not limited thereto.

The output signal OUT_SAE from the source or drain area, which is shared by the first and second transistors TR1 and TR2, may be output through a fourth conductive line M4. The output signal OUT_SAE from the source or drain area, which is shared by the third and fourth transistors TR3 and TR4, may be output through the fourth conductive line M4.

According to the layout and bias condition described with reference to FIG. 11, the first driver 421, which is composed of the second and fourth transistors TR2 and TR4, may improve the driving ability of the first inverter 411. That is, a delay time of the delay chain block 410 may be shorter than that of the delay chain block 310 (refer to FIG. 8).

The delay chain circuit 400 may be implemented as illustrated in FIG. 10 by appropriately placing the layout illustrated in FIG. 11. Because outputs of the first inverter 411 and the first driver 421 are used as an input of the second inverter 412, an appropriate conductive line for such a configuration may be used. Thus, a detailed description thereof will not be repeated here.

As described above, it is understood from FIGS. 9 and 11 that the above-described semiconductor devices, which perform different functions, have similar layouts. That is, the isolation circuit 320 of FIG. 9 may electrically insulate the delay chain block 310 from another device, and the driving circuit 420 of FIG. 11 may reduce a delay time of the delay chain block 410 (i.e., WL-to-SAE term). A difference between the isolator 320 of FIG. 9 and the driving circuit 420 of FIG. 11 may be determined according to a bias condition and whether the second and forth transistors TR2 and TR4 share a gate electrode.

According to the example embodiments described with reference to FIGS. 8 to 11, devices, which differently affect the delay chain blocks 310 and 410, may be implemented by using substantially the same layout but differently adjusting only bias conditions. As a result, a device, which improves area efficiency, insulating performance, or driving ability, may be selectively used according to a configuration of the SRAM.

Figure 12:
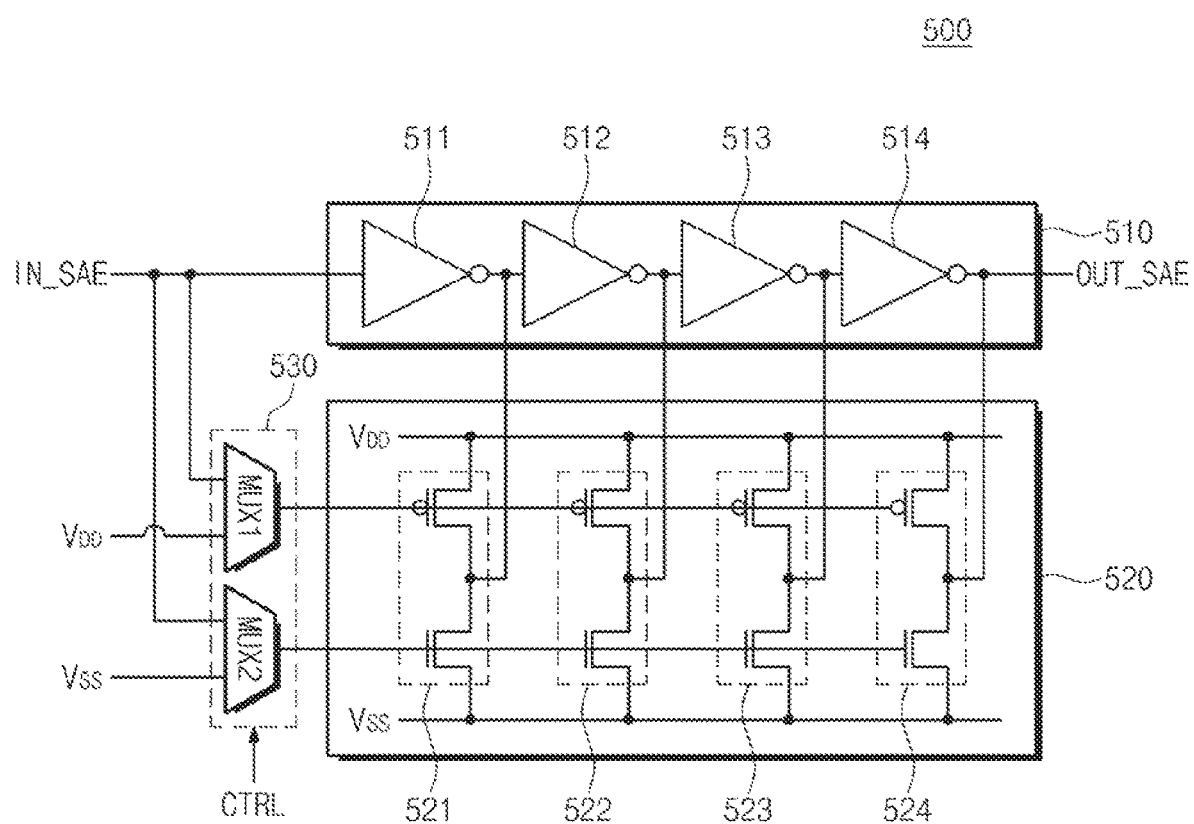
FIG. 12 is a detailed circuit diagram of the delay chain circuit of FIG. 5.

FIG. 12 is a detailed circuit diagram of the delay chain circuit 242 of FIG. 5. For example, a delay chain circuit 500 illustrated in FIG. 12 may be one of the first and second SRAMs 110 and 120 that are illustrated in FIG. 4. To help understanding, example embodiments will be described with reference to FIGS. 5, 6, 7, and 12.

The delay chain circuit 500 may include a delay chain block 510, an assistance block 520, and a multiplexing circuit 530. The delay chain block 510 may include a plurality of inverters 511 to 514 serially connected to each other. In example embodiments, the delay chain block 510 includes four inverters. However, example embodiments are not limited thereto. The assistance block 520 may include first to fourth assistance blocks 521 to 524. Likewise, in example embodiments, the delay chain circuit 500 includes four assistance blocks. However, example embodiments are not limited thereto.

The delay chain block 510 may receive an input signal to output the delayed input signal. For example, the delay chain block 510 may receive the sense amplifier enable signal IN_SAE to output the delayed sense amplifier enable signal OUT_SAE. For example, the sense amplifier enable signal IN_SAE may be delayed by (t2−t1) through the delay chain block 510. For example, each of the inverters constituting the delay chain block 510 may be implemented with PMOS and NMOS transistors.

Each of the first to fourth assistance blocks 521 to 524 may include a PMOS transistor and an NMOS transistor that are serially connected to each other. A power supply voltage $V_{DD}$ may be applied to one end of the PMOS transistor, and a ground voltage $V_{SS}$ may be applied to one end of the NMOS transistor. Furthermore, an output terminal between the PMOS transistor and the NMOS transistor may be connected to an output terminal of a first inverter 511 corresponding thereto.

A first multiplexer MUX1 may be connected to gate electrodes of PMOS transistors that constitute the first to fourth assistance blocks 521 to 524. Furthermore, a second multiplexer MUX2 may be connected to gate electrodes of NMOS transistors that constitute the first to fourth assistance blocks 521 to 524. The first multiplexer MUX1 may select one of the sense amplifier enable signal IN_SAE and the power supply voltage $V_{DD}$ under control of the external device. In addition, the second multiplexer MUX2 may select one of the sense amplifier enable signal IN_SAE and the ground voltage $V_{SS}$ under control of the external device.

Figure 13:
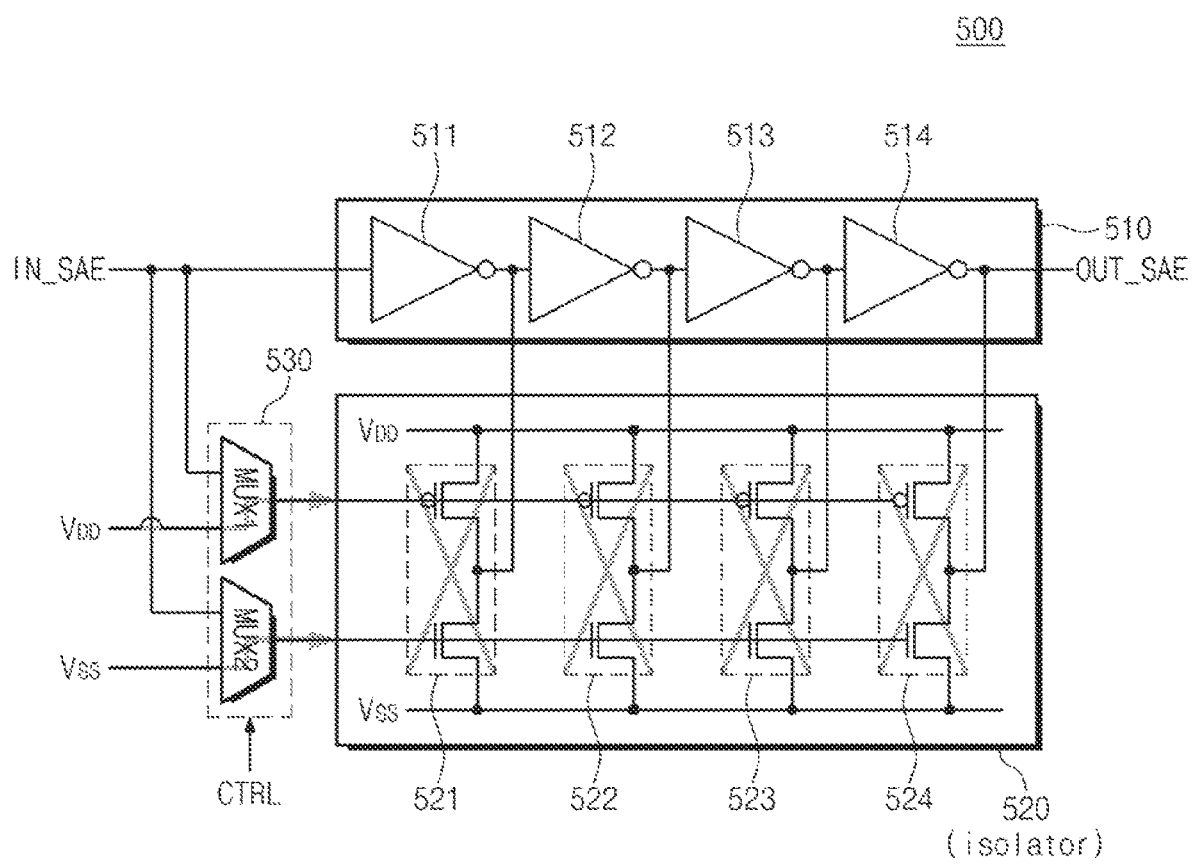
FIG. 13 is a circuit diagram of the delay chain circuit illustrated in FIG. 12, at a first operation mode.

FIG. 13 is a circuit diagram of the delay chain circuit 500 illustrated in FIG. 12, at the first operation mode. During the first operation mode, the first multiplexer MUX1 may select the power supply voltage $V_{DD}$ among the sense amplifier enable signal IN_SAE and the power supply voltage $V_{DD}$ based on a control signal CTRL. Furthermore, during the first operation mode, the second multiplexer MUX2 may select the ground voltage $V_{SS}$ among the sense amplifier enable signal IN_SAE and the ground voltage $V_{SS}$ based on the control signal CTRL. In this case, transistors constituting the assistance block 520 may be turned off, and thus the assistance block 520 may electrically insulate the delay chain block 510 from another device. This electrical insulating function may be similar to described with reference to FIG. 8, and thus a duplicated description will not be repeated here.

Figure 14:
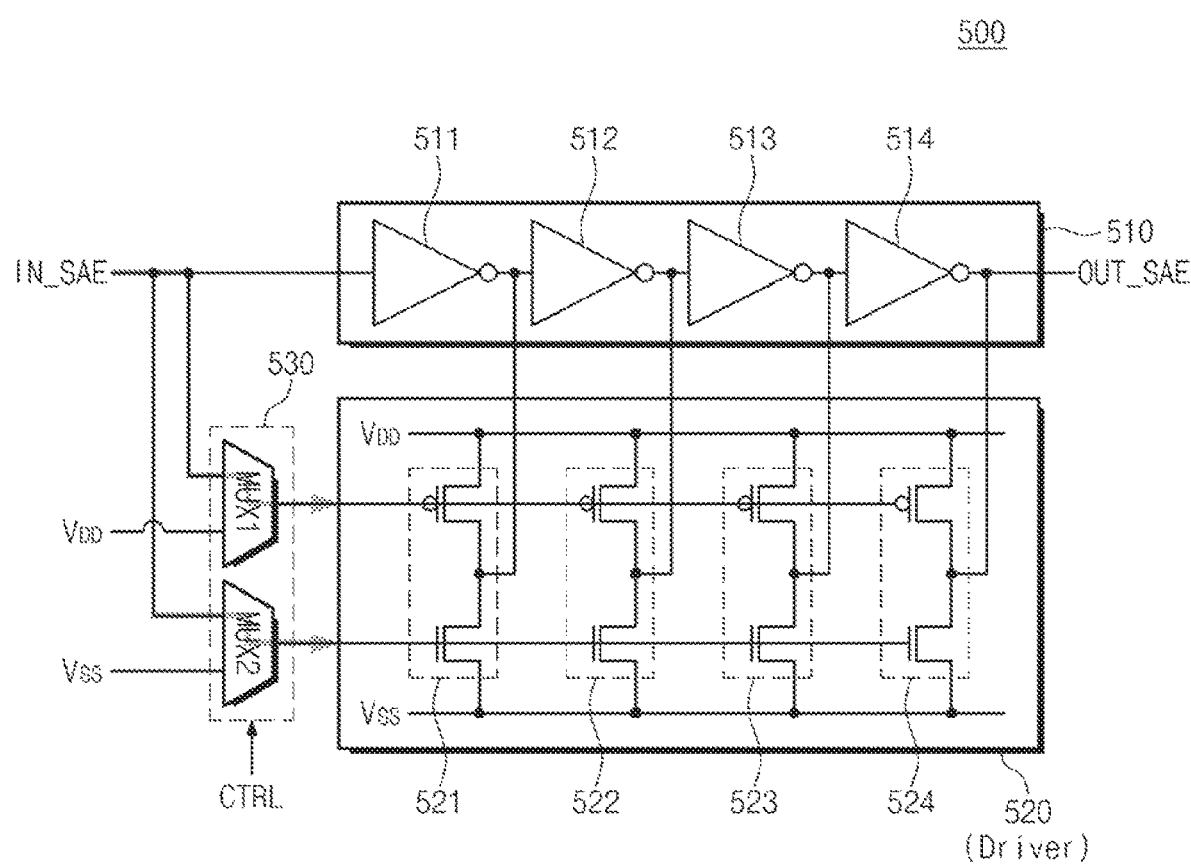
FIG. 14 a circuit diagram of the delay chain circuit illustrated in FIG. 12, at a second operation mode.

FIG. 14 is a circuit diagram of the delay chain circuit 500 illustrated in FIG. 12, at the second operation mode. During a second operation mode, the first multiplexer MUX1 may select the sense amplifier enable signal IN_SAE among the sense amplifier enable signal IN_SAE and the power supply voltage $V_{DD}$ based on the control signal CTRL. Furthermore, during the second operation mode, the second multiplexer MUX2 may select the sense amplifier enable signal IN_SAE among the sense amplifier enable signal IN_SAE and the ground voltage $V_{SS}$ based on the control signal CTRL. In this case, transistors constituting the assistance block 520 may be turned on, and thus the assistance block 520 may serve as a driver that improves driving ability of the delay chain block 510. This driver function may be similar to that described with reference to FIG. 10, and thus a duplicated description will not be repeated here.

According to the above-described, an operation mode may be selected according to a control signal from the external device. For example, to maintain the WL-to-SAE term of the SRAM to be long, the delay chain circuit 500 may enter the first operation mode based on the control signal CTRL. In this case, the assistance block 520 may operate as an isolation circuit; the WL-to-SAE term of the SRAM may be affected by the delay chain block 510. In contrast, to maintain the WL-to-SAE term of the SRAM to be short, the delay chain circuit 500 may enter the first operation mode based on the control signal CTRL. In this case, because the assistance block 520 operates as a driving circuit; the WL-to-SAE term of the SRAM may be reduced due to an increase of driving ability by the assistance block 520.

Figure 15:
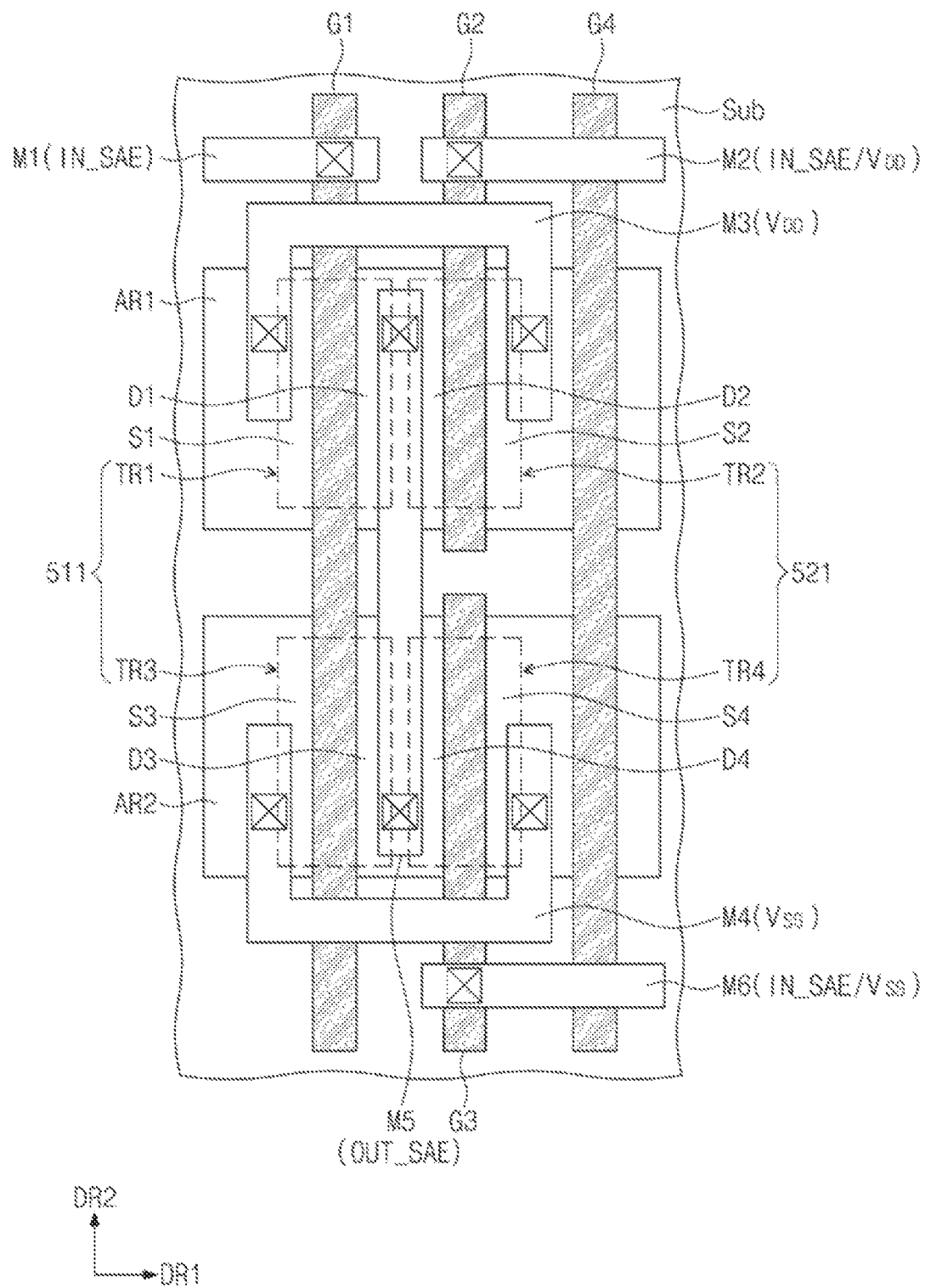
FIG. 15 is a plan view illustrating a portion of a layout of the delay chain circuit illustrated in FIG. 12.

FIG. 15 is a plan view illustrating a portion of a layout of the delay chain circuit 500 illustrated in FIG. 12. In example embodiments, a layout of the first inverter 511 and the first assistance block 521 of the delay chain circuit 500 is illustrated in FIG. 13.

To help understanding, referring to FIGS. 12 and 15, the first and second active regions AR1 and AR2 may be formed on a substrate. Each of the first and second active regions AR1 and AR2 may include source and drain areas, and channel areas for forming transistors. For example, the substrate Sub may be a silicon substrate, a germanium substrate, or a silicon on insulator (SOI) substrate.

The first and second transistors TR1 and TR2 may be formed on the first active region AR1. For example, each of the first and second transistors TR1 and TR2 may be a PMOS FET.

The first and second transistors TR1 and TR2 may include respective gate electrodes G1 and G2 formed to extend in the second direction DR2, and each of the first and second transistors TR1 and TR2 may include source areas S1 and S2 and drain areas D1 and D2 formed on the first active region AR1 and arranged at opposite sides of each of the gate electrodes G1 and G2, and channel areas. As illustrated in FIG. 15, the first to second transistors TR1 to TR2 may be serially connected to each other. That is, the first and second transistors TR1 and TR2 may share a source or drain area.

The third and fourth transistors TR3 and TR4 may be formed on the second active region AR2. For example, each of the third and fourth transistors TR3 and TR4 may be an NMOS FET.

The third and fourth transistors TR3 and TR4 may include respective gate electrodes G1 and G3 formed to extend in the second direction DR2, and each of the third and fourth transistors TR3 and TR4 may include source areas S1 and S2 and drain areas D1 and D2 formed on the first active region AR2 and arranged at opposite sides of each of the gate electrodes G1 and G3, and channel areas. As illustrated in FIG. 15, the third to fourth transistors TR3 to TR4 may be serially connected to each other. That is, the fourth transistor TR4 may not share a gate electrode with a second transistor TR2. Furthermore, the third and fourth transistors TR3 and TR4 may share a source or drain area.

The sense amplifier enable signal IN_SAE may be applied to the first gate electrode G1. For example, the sense amplifier enable signal IN_SAE may be applied to the first gate electrode G1 through a first conductive line M1.

The sense amplifier enable signal IN_SAE or the power supply voltage $V_{DD}$ may be selectively applied to the second gate electrodes G2. For example, the first multiplexer MUX1 may selectively apply the power supply voltage $V_{DD}$ to the second gate electrode G1 based on the control signal from the external device. For example, the sense amplifier enable signal IN_SAE or the power supply voltage $V_{DD}$ may be applied to the second gate electrode G2 through a second conductive line M2.

The power supply voltage $V_{DD}$ may be applied to a source or drain area of the first transistor TR1, and the power supply voltage $V_{DD}$ may be applied to a source or drain area of the second transistor TR2. The ground voltage $V_{SS}$ may be applied to a source or drain area of the third transistor TR3, and the ground voltage $V_{SS}$ may be applied to a source or drain area of the fourth transistor TR4.

For example, the power supply voltage $V_{DD}$ may be applied to the first and second transistors TR1 and TR2 through a third conductive line M3. For example, the ground voltage $V_{SS}$ may be applied to the third and fourth transistors TR3 and TR4 through a fourth conductive line M4. However, the configuration for applying the power supply voltage $V_{DD}$ and the ground voltage $V_{SS}$ is not limited thereto.

An output signal OUT_SAE from a source or drain area, which is shared by the first and second transistors TR1 and TR2, may be output through a fifth conductive line M5. Furthermore, the output signal OUT_SAE from a source or drain area, which is shared by the third and fourth transistors TR3 and TR4, may be output through the fifth conductive line M5. However, when the delay chain circuit 500 operates at the first operation mode, the assistance block 520 may operate as an isolation circuit. Accordingly, an output from the second and fourth transistors TR2 and TR4 may be absent.

A function of the assistance block 520 may be selected according to the layout and bias condition described with reference to FIG. 13. For example, when the delay chain circuit 500 operates under the first operation mode, the power supply voltage $V_{DD}$ may be applied to the second conductive line M2, and the ground voltage $V_{SS}$ may be applied to a sixth conductive line M6. As a result, the first assistance block 521, which is composed of the second transistor TR2 and the fourth transistor TR4, may electrically insulate the first inverter 311 composed of the first transistor TR1 and the third transistor TR3 from another device.

In contrast, when the delay chain circuit 500 operates under the second operation mode, the sense amplifier enable signal IN_SAE may be applied to the second conductive line M2, and the sense amplifier enable signal IN_SAE may be applied to a sixth conductive line M6. As a result, the first assistance block 521, which is composed of the second and fourth transistors TR2 and TR4, may electrically operate as a driver that improves driving ability of the first inverter 511 composed of the first and third transistors TR1 and TR3.

An operation mode of the delay chain circuit 500 may be selected according to a configuration of the SRAM (e.g., the number of the SRAMs connected to a bit line pair BL and /BL), thereby improving area efficiency, insulating performance, or driving ability of the SRAM. Moreover, the reliability of the SRAM may be enhanced.

As described above, the layout of the semiconductor device that adjusts the WL-to-SAE term of the SRAM based on an operation mode is described. However, a semiconductor device that performs different functions based on the operation mode may be also used as a driving circuit for driving a load. For example, the input/output circuit 250 illustrated in FIG. 5 may be the driving circuit, which will be described with reference to FIGS. 16 to 21 in more detail.

Figure 16:
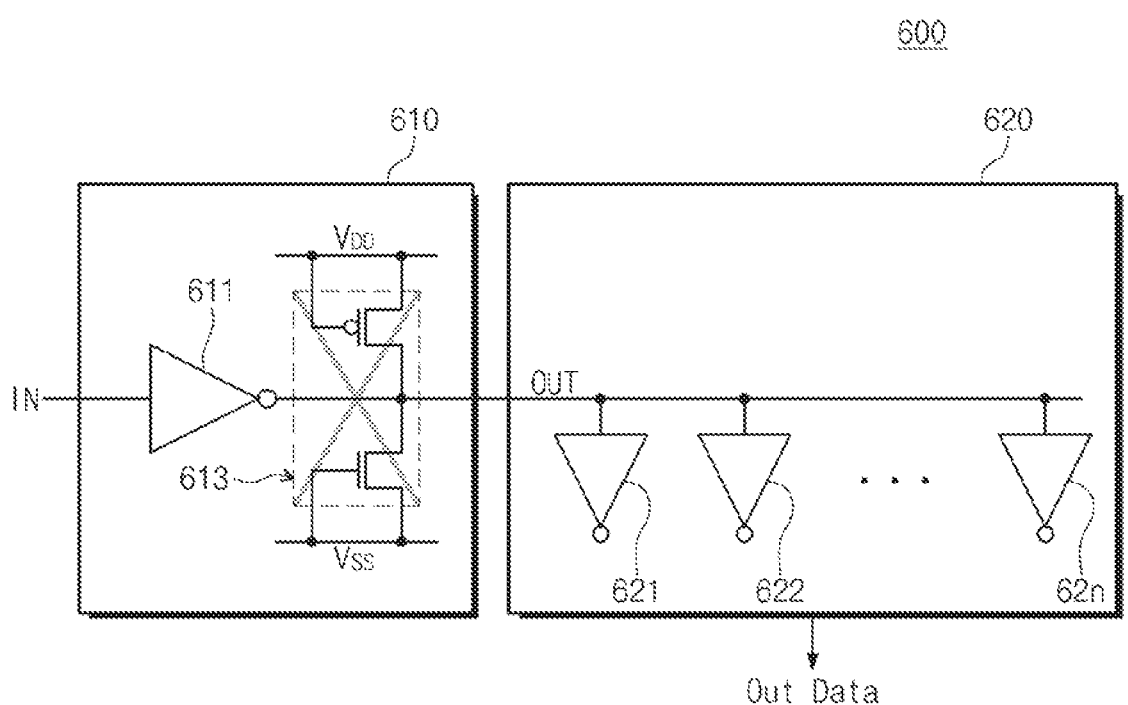
FIG. 16 is a detailed circuit diagram of an input/output circuit illustrated in FIG. 5.

FIG. 16 is a circuit diagram illustrating the input/output circuit 250 illustrated in FIG. 5. For example, an input/output circuit 600 illustrated in FIG. 16 may be an input/output circuit of the second SRAM 120 illustrated in FIG. 4. That is, the input/output circuit 600 illustrated in FIG. 16 may be used when the number of loads is relatively small (i.e., when a size of the SRAM is relatively small).

The input/output circuit 600 may include a driving circuit 610 and a load circuit 620. The driving circuit 610 may include an inverter 611 and an isolator 613. The load circuit 620 may include a plurality of loads 621 to 62n. For example, the driving circuit 610 that receives an input signal IN may output an output signal OUT. Furthermore, each of the loads connected to the load circuit 620 may be driven by an output signal OUT to output data.

The isolator 613 may include a PMOS transistor and an NMOS transistor. A power supply voltage $V_{DD}$ may be applied to one end of the PMOS transistor, and a ground voltage $V_{SS}$ may be applied to one end of the NMOS transistor. The power supply voltage $V_{DD}$ may be applied to a gate terminal of the PMOS transistor, and the ground voltage $V_{SS}$ may be applied to a gate terminal of the NMOS transistor. As a result, transistors constituting the isolator 613 may be turned off, and thus the isolator 613 may electrically insulate the inverter 611 from other circuits adjacent to the inverter 611.

Figure 17:
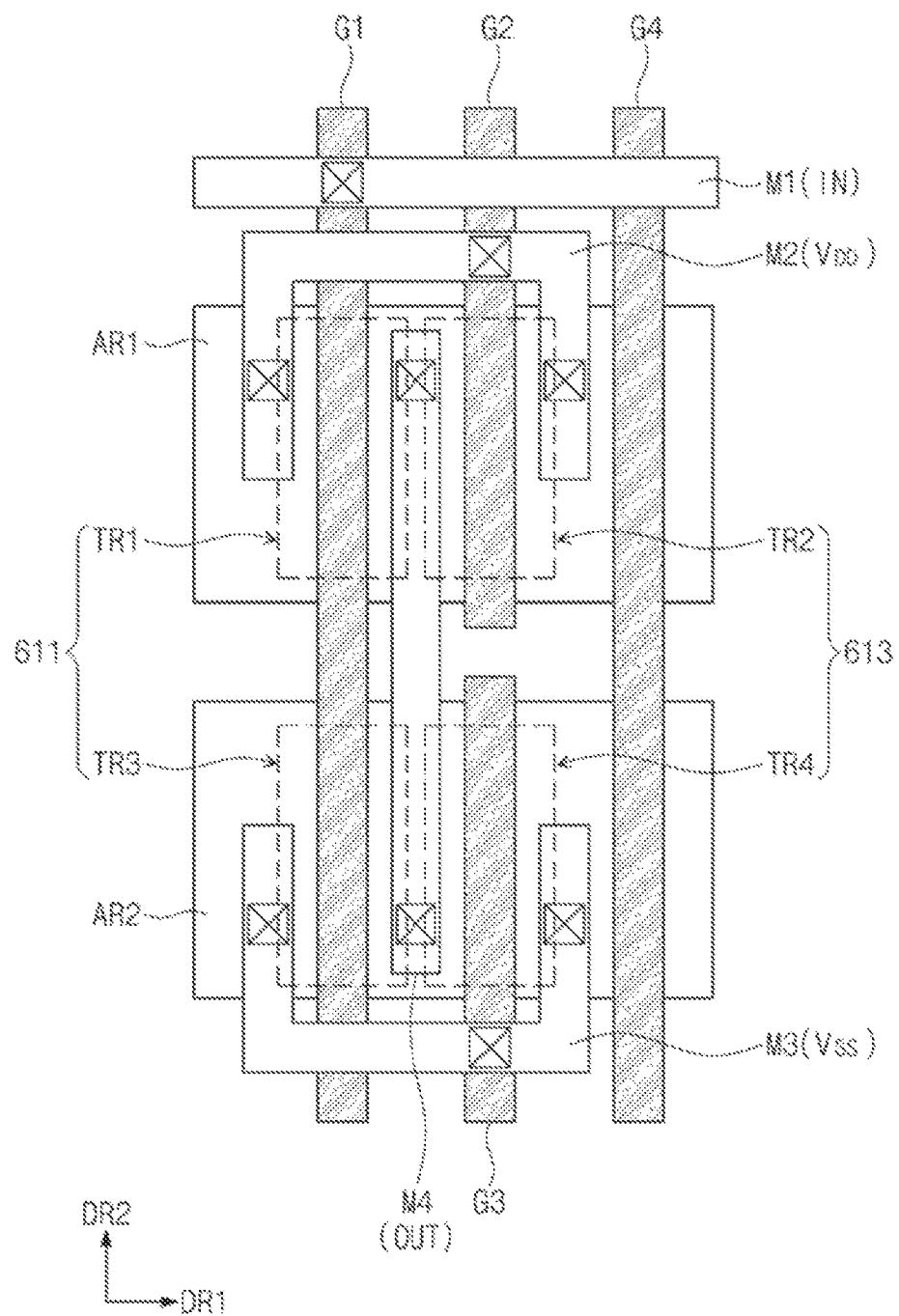
FIG. 17 is a plan view illustrating a portion of a layout of a driving circuit illustrated in FIG. 16.

FIG. 17 is a plan view illustrating a portion of a layout of the driving circuit 610 illustrated in FIG. 16. To help understanding, referring to FIGS. 16 and 17, first and second active regions AR1 and AR2 may be formed on a substrate. Each of the first and second active regions AR1 and AR2 may include source and drain areas, and channel areas for forming transistors. For example, the substrate Sub may be a silicon substrate, a germanium substrate, or a silicon on insulator (SOI) substrate.

The first and second transistors TR1 and TR2 may be formed on the first active region AR1. For example, each of the first and second transistors TR1 and TR2 may be a PMOS FET.

The first and second transistors TR1 and TR2 may include respective gate electrodes G1 and G2 formed to extend in the second direction DR2, and each of the first and second transistors TR1 and TR2 may include source and drain areas formed on the first active region AR1 and arranged at opposite sides of each of the gate electrodes, and a channel area. As illustrated in FIG. 17, the first to second transistors TR1 to TR2 may be serially connected to each other. That is, the first and second transistors TR1 and TR2 may share a source or drain area.

The third and fourth transistors TR3 and TR4 may be formed on the second active region AR2. For example, each of the third and fourth transistors TR3 and TR4 may be an NMOS FET.

The third and fourth transistors TR3 and TR4 may include respective gate electrodes G1 and G3 formed to extend in the second direction DR2, and each of the third and fourth transistors TR3 and TR4 may include source and drain areas formed on the first active region AR2 and arranged at opposite sides of each of the gate electrodes G1 and G3, and channel areas. That is, the second and fourth transistors TR2 and TR4 may not share a gate electrode. As illustrated in FIG. 17, the third to fourth transistors TR3 to TR4 may be serially connected to each other. That is, the third and fourth transistors TR3 and TR4 may share a source or drain area.

An input voltage IN may be provided to the first gate electrode G1. The power supply voltage $V_{DD}$ may be applied to the second gate electrode G2. In addition, the ground voltage $V_{SS}$ may be applied to the third gate electrode G3. For example, the input signal IN may be applied to the first gate electrode G1 through a first conductive line M1. For example, the power supply voltage $V_{DD}$ may be applied to the second gate electrode G2 through a second conductive line M2. For example, the ground voltages $V_{SS}$ may be applied to the third gate electrode G3 through a third conductive line M3.

The power supply voltage $V_{DD}$ may be applied to a source or drain area of the first transistor TR1, and the power supply voltage $V_{DD}$ may be applied to a source or drain area of the second transistor TR2. The ground voltage $V_{SS}$ may be applied to a source or drain area of the third transistor TR3, and the ground voltage $V_{SS}$ may be applied to a source or drain area of the fourth transistor TR4.

For example, the power supply voltage $V_{DD}$ may be applied to the first and second transistors TR1 and TR2 through the second conductive line M2. For example, the ground voltage $V_{SS}$ may be applied to the third and fourth transistors TR3 and TR4 through the third conductive line M3. However, the configuration for applying the power supply voltage $V_{DD}$ and the ground voltage $V_{SS}$ is not limited thereto.

An output signal OUT from a source or drain area shared by the first and second transistors TR1 and TR2 may be output through a fourth conductive line M4. Furthermore, the output signal OUT_SAE from a source or drain area, which is shared by the third and fourth transistors TR3 and TR4, may be output through a fourth conductive line M4. However, in example embodiments, the isolator 613, which is composed of the second transistor TR2 and the fourth transistor TR2, may be in a turn-off state. Accordingly, a signal, which is output through the fourth conductive line M4, may be a signal that is output from an inverter 611 composed of the first transistor TR1 and the third transistor TR3.

According to the layout and bias condition described with reference to FIG. 17, the isolator 613, which is composed of the second transistor TR2 and the fourth transistor TR4, may electrically insulate the inverter 611 from another device. For example, the isolator 613 may electrically insulate the inverter 611 from a transistor including the fourth gate electrode G4.

Figure 18:
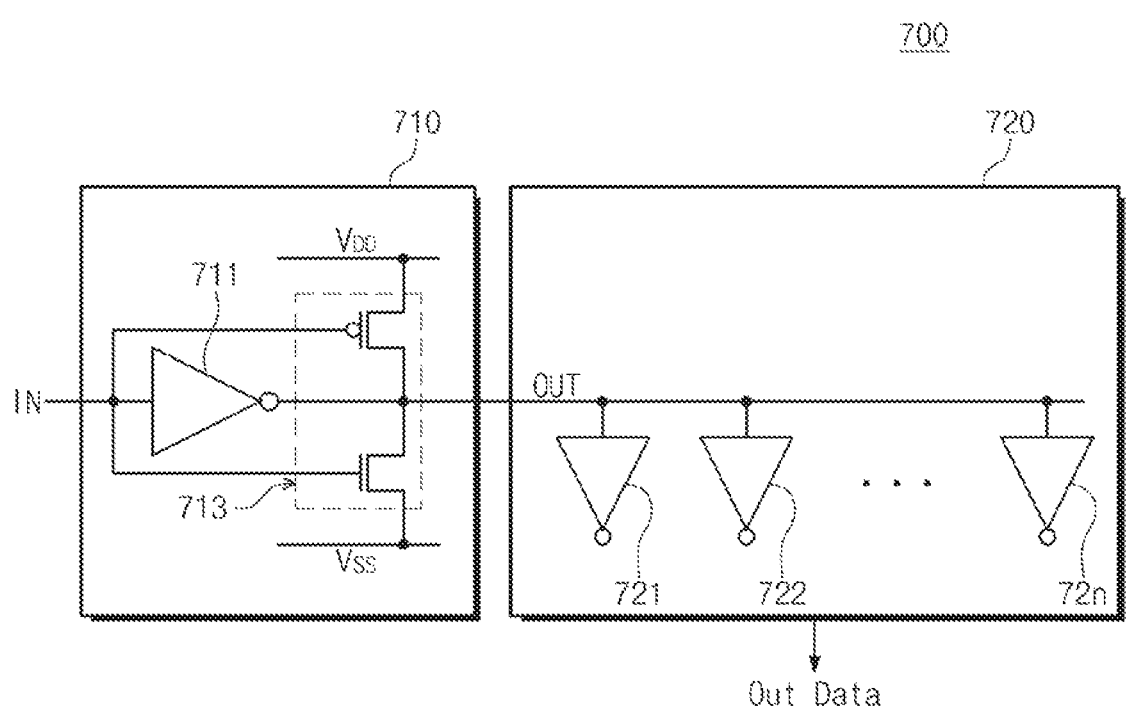
FIG. 18 is a detailed circuit diagram of the input/output circuit illustrated in FIG. 5.

FIG. 18 is a circuit diagram illustrating the input/output circuit 250 illustrated in FIG. 5. For example, an input/output circuit 700 illustrated in FIG. 18 may be an input/output circuit of the first SRAM 110 illustrated in FIG. 4. That is, the input/output circuit 700 illustrated in FIG. 18 may be used when the number of loads is relatively greater (i.e., when a size of the SRAM is relatively greater).

The input/output circuit 700 may include a driving circuit 710 and a load circuit 720. The driving circuit 710 may include an inverter 711 and a driver 713. The load circuit 720 may include a plurality of loads 721 to 72n. For example, the number of the loads 721 to 72n illustrated in FIG. 18 may be greater than that of the loads 621 to 62n illustrated in FIG. 16.

The driver 713 may include a PMOS transistor and an NMOS transistor. A power supply voltage $V_{DD}$ may be applied to one end of the PMOS transistor, and a ground voltage $V_{SS}$ may be applied to one end of the NMOS transistor. An input signal IN may be applied to a gate terminal of the PMOS transistor and a gate terminal of the NMOS transistor. As a result, the driver 713 may improve driving ability of the driving circuit 710. In the other, even though the number of the loads 721 to 72n is relatively greater, it is possible to secure driving ability sufficient to drive the loads 721 to 72n.

Figure 19:
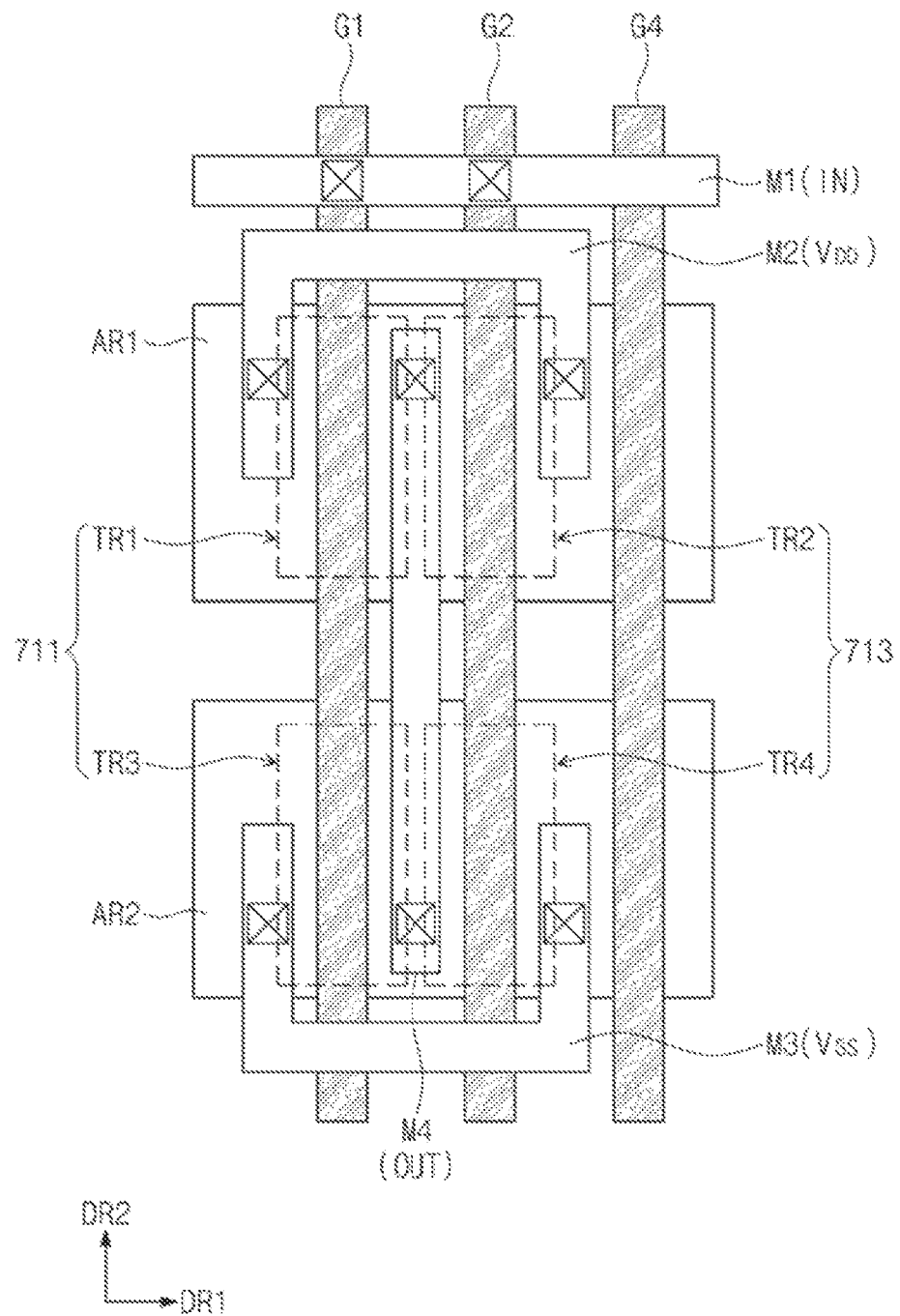
FIG. 19 is a plan view illustrating a portion of a layout of a driving circuit illustrated in FIG. 18.

FIG. 19 is a plan view illustrating a portion of a layout of the driving circuit 710 illustrated in FIG. 18. To help understanding, referring to FIGS. 18 and 19, the first and second active regions AR1 and AR2 may be formed on a substrate. Each of the first and second active regions AR1 and AR2 may include source and drain areas, and channel areas for forming transistors. For example, the substrate Sub may be a silicon substrate, a germanium substrate, or a silicon on insulator (SOI) substrate.

The first and second transistors TR1 and TR2 may be formed on the first active region AR1. For example, each of the first and second transistors TR1 and TR2 may be a PMOS FET.

The first and second transistors TR1 and TR2 may include respective gate electrodes G1 and G2 formed to extend in the second direction DR2, and each of the first and second transistors TR1 and TR2 may include source and drain areas formed on the first active region AR1 and arranged at opposite sides of each of the gate electrodes G1 and G2, and channel areas. As illustrated in FIG. 17, the first to second transistors TR1 to TR2 may be serially connected to each other. That is, the first and second transistors TR1 and TR2 may share a source or drain area.

The third and fourth transistors TR3 and TR4 may be formed on the second active region AR2. For example, each of the third and fourth transistors TR3 and TR4 may be an NMOS FET.

The third and fourth transistors TR3 and TR4 may include respective gate electrodes G1 and G2 formed to extend in the second direction DR2, and each of the third and fourth transistors TR3 and TR4 may include source and drain areas formed on the first active region AR2 and arranged at opposite sides of each of the gate electrodes G1 and G2, and channel areas. As illustrated in FIG. 19, the third to fourth transistors TR3 to TR4 may be serially connected to each other. That is, the third and fourth transistors TR3 and TR4 may share a source or drain area.

The input signal IN may be applied to first and second gate electrodes G1 and G2. The power supply voltage $V_{DD}$ may be applied to the second gate electrode G2. For example, the input signal IN may be applied to the first and second gate electrodes G1 and G2 through a first conductive line M1.

The power supply voltage $V_{DD}$ may be applied to the source or drain area of the first transistor TR1, and the power supply voltage $V_{DD}$ may be applied to the source or drain area of the second transistor TR2. The ground voltage $V_{SS}$ may be applied to the source or drain area of the third transistor TR3, and the ground voltage $V_{SS}$ may be applied to the source or drain area of the fourth transistor TR4.

For example, the power supply voltage $V_{DD}$ may be applied to the first and second transistors TR1 and TR2 through the second conductive line M2. For example, the ground voltage $V_{SS}$ may be applied to the third and fourth transistors TR3 and TR4 through a third conductive line M3. However, the configuration for applying the power supply voltage $V_{DD}$ and the ground voltage $V_{SS}$ is not limited thereto.

An output signal OUT from a source or drain area, which is shared by the first and second transistors TR1 and TR2, may be output through a fourth conductive line M4. Furthermore, the output signal OUT_SAE from a source or drain area, which is shared by the third and fourth transistors TR3 and TR4, may be output through the fourth conductive line M4.

According to the layout and bias condition described with reference to FIG. 19, the driver 713, which is composed of the second and fourth transistors TR2 and TR4, may improve driving ability of the driving circuit 710.

As described above, semiconductor devices that perform different functions are described with reference to FIGS. 17 and 19, but it is understood that the layouts thereof are similar to each other. That is, the isolator 613 of FIG. 17 may electrically insulate the inverter 711 from another device, and the driver 713 of FIG. 19 may improve driving ability of the driving circuit 710. The difference between the isolator 613 of FIG. 17 and the driver 713 of FIG. 19 may be different form each other in terms of the bias conditions and whether the second and forth transistors TR2 and TR4 share a gate electrode.

According to the example embodiments illustrated with reference to FIGS. 16 to 19, devices that have different impacts on the driving circuit 710 may be implemented by using substantially the same layout and differently adjusting only bias conditions. As a result, a device that improves area efficiency, insulating performance, or driving ability may be selectively used according to a configuration of the SRAM.

Figure 20:
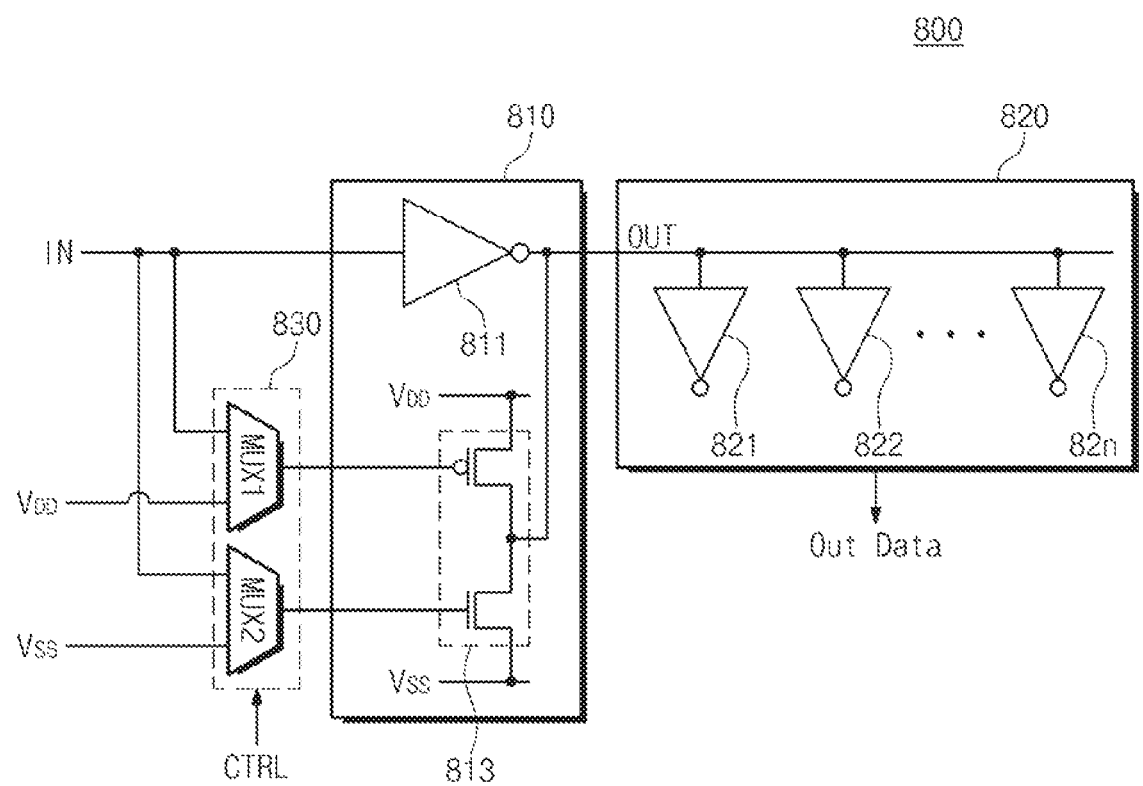
FIG. 20 is a detailed circuit diagram of the input/output circuit of FIG. 5.

FIG. 20 is a detailed circuit diagram of the input/output circuit 250 of FIG. 5. For example, an input/output circuit 800 illustrated in FIG. 20 may be one of the first SRAM 110 and the second SRAM 120 that are illustrated in FIG. 4. The input/output circuit 800 may include a driving circuit 810, a load circuit 820, and a multiplexing circuit 830.

The driving circuit 810 may include an inverter 811 and an assistance circuit 813. The load circuit 820 may include a plurality of loads 821 to 82n. The driving circuit 810 may receive an input signal IN to output an output signal OUT. The inverter 811 of the driving circuit 810 and the assistance circuit 813 may have output terminals thereof connected to each other.

A power supply voltage $V_{DD}$ may be applied to one end of a PMOS transistor, and a ground voltage $V_{SS}$ may be applied to one end of an NMOS transistor. A gate electrode of the PMOS transistor of the assistance circuit 813 may be connected to an output terminal of a first multiplexer MUX1, and a gate electrode of the NMOS transistor of the assistance circuit 813 may be connected to an output terminal of a second multiplexer MUX2.

The first multiplexer MUX1 may select one of the input signal IN and the power supply voltage $V_{DD}$ based on the control signal CTRL from the external device. Furthermore, the second multiplexer MUX2 may select one of the input signal IN and the ground voltage $V_{SS}$ based on the control signal CTRL from the external device.

For example, during the first operation mode, the first multiplexer MUX1 may select the power supply voltage $V_{DD}$ under control of the control signal CTRL, and the second multiplexer MUX2 may select the ground voltage $V_{SS}$ under control of the control signal CTRL. As a result, the assistance circuit 813 may operate as an isolator that electrically insulates the inverter 811 from another device. Because the assistance circuit 813 operates as the isolator, driving ability, which the driving circuit 810 originally has, may be maintained as it is. Accordingly, an operation of the input/output circuit 800 at the first operation mode may be relatively suitable for the second SRAM 120 (refer to FIG. 4).

In contrast, during the second operation mode, the first and second multiplexers MUX1 and MUX2 may select the input signal IN under the control signal CTRL. As a result, the assistance circuit 813 may operate as a driver that improves driving ability of the driving circuit 810. Because the assistance circuit 813 operates as the driver, driving ability that the driving circuit 810 has originally may be improved. Accordingly, an operation of the input/output circuit 800 at the second operation mode may be relatively suitable for the first SRAM 110 (refer to FIG. 4).

Figure 21:
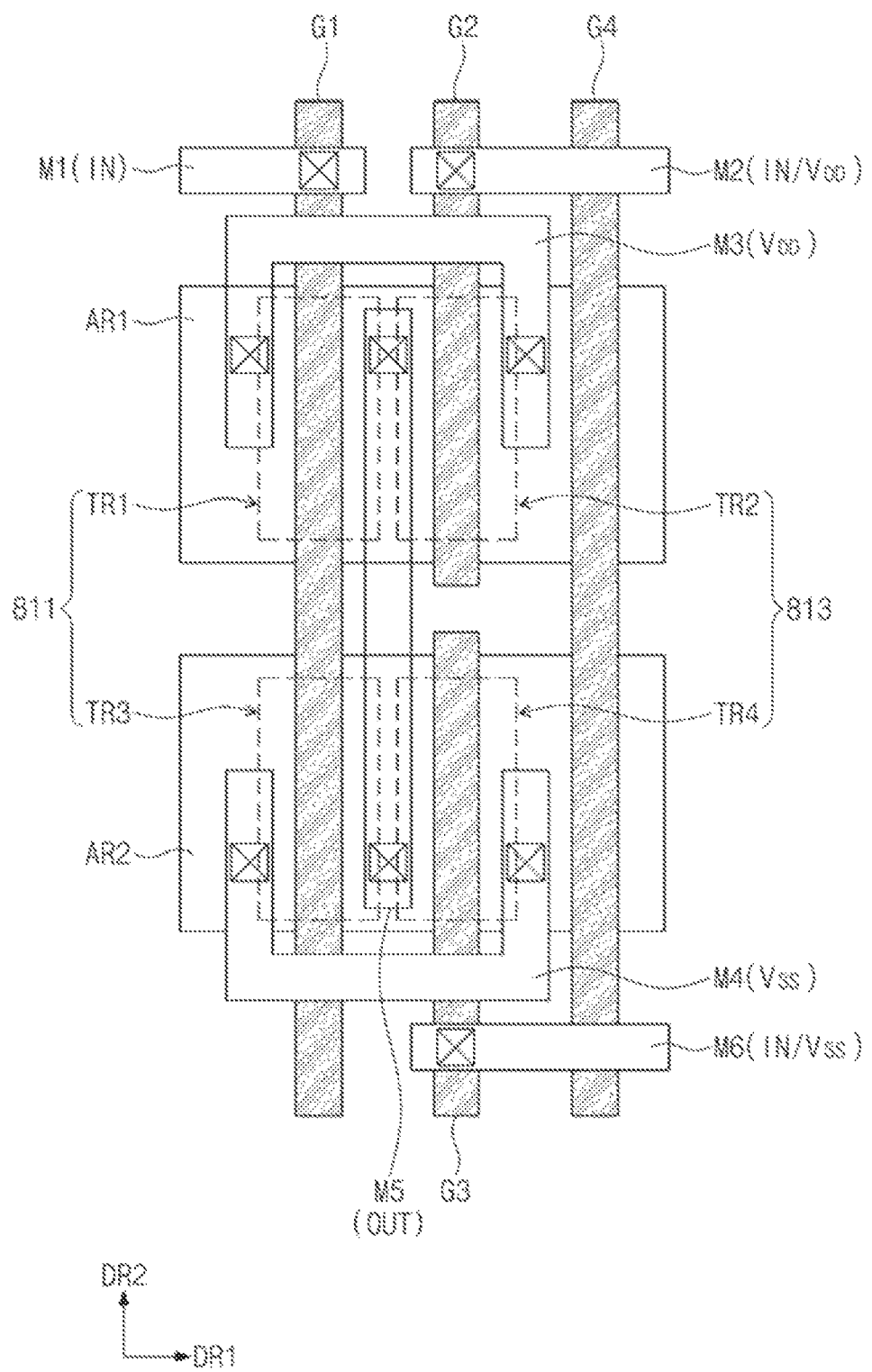
FIG. 21 is a plan view illustrating a portion of a layout of a driving circuit illustrated in FIG. 20.

FIG. 21 is a plan view illustrating a portion of a layout of the input/output circuit 810 illustrated in FIG. 20. In example embodiments, a layout of the inverter 811 and the assistance circuit 813 of the input/output circuit 800 is illustrated in FIG. 21.

To help understanding, referring to FIGS. 20 and 21, first and second active regions AR1 and AR2 may be formed on a substrate. Each of the first and second active regions AR1 and AR2 may include source and drain areas, and channel areas for forming transistors. For example, the substrate Sub may be a silicon substrate, a germanium substrate, or a silicon on insulator (SOI) substrate.

The first and second transistors TR1 and TR2 may be formed on the first active region AR1. For example, each of the first and second transistors TR1 and TR2 may be a PMOS FET.

The first and second transistors TR1 and TR2 may include respective gate electrodes G1 and G2 formed to extend in the second direction DR2, and each of the first and second transistors TR1 and TR2 may include source and drain areas formed on the first active region AR1 and arranged at opposite sides of each of the gate electrodes, and a channel area. As illustrated in FIG. 21, the first to second transistors TR1 to TR2 may be serially connected to each other. That is, the first and second transistors TR1 and TR2 may share a source or drain area.

The third and fourth transistors TR3 and TR4 may be formed on the second active region AR2. For example, each of the third and fourth transistors TR3 and TR4 may be an NMOS FET.

The third and fourth transistors TR3 and TR4 may include respective gate electrodes G1 and G3 that are formed to extend in the second direction DR2, and each of the third and fourth transistors TR3 and TR4 may include source and drain areas formed on the first active region AR2 and arranged at opposite sides of each of the gate electrodes, and a channel area. As illustrated in FIG. 21, the third to fourth transistors TR3 to TR4 may be serially connected to each other. That is, the fourth transistor TR4 may not share a gate electrode with a second transistor TR2. Furthermore, the third and fourth transistors TR3 and TR4 may share a source or drain area.

An input voltage IN may be provided to a first gate electrode G1. For example, the input signal IN may be applied to the first gate electrode G1 through a first conductive line M1.

The input signal IN or the power supply voltage $V_{DD}$ may be selectively applied to a second gate electrode G2. For example, the first multiplexer MUX1 may selectively apply the power supply voltage $V_{DD}$ to the second gate electrode G1 based on the control signal CTRL from the external device. For example, the input signal IN or the power supply voltage $V_{DD}$ may be applied to the second gate electrode G2 through a second conductive line M2.

The power supply voltage $V_{DD}$ may be applied to the source or drain area of the first transistor TR1, and the power supply voltage $V_{DD}$ may be applied to the source or drain area of the second transistor TR2. The ground voltage $V_{SS}$ may be applied to the source or drain area of the third transistor TR3, and the ground voltage $V_{SS}$ may be applied to the source or drain area of the fourth transistor TR4.

For example, the power supply voltage $V_{DD}$ may be applied to the first and second transistors TR1 and TR2 through a third conductive line M3. For example, the ground voltage $V_{SS}$ may be applied to the third and fourth transistors TR3 and TR4 through a fourth conductive line M4. However, the configuration for applying the power supply voltage $V_{DD}$ and the ground voltage $V_{SS}$ is not limited thereto.

An output signal OUT from a source or drain area, which is shared by the first and second transistors TR1 and TR2, may be output through a fifth conductive line M5. Furthermore, the output signal OUT from a source or drain area, which is shared by the third and fourth transistors TR3 and TR4, may be output through the fifth conductive line M5. However, when the input/output circuit 800 operates at the first operation mode, the assistance circuit 813 may operate as an isolator. Accordingly, an output from the second and fourth transistors TR2 and TR4 may be absent.

A function of the assistance circuit 813 may be selected based on the layout and bias condition described with reference to FIG. 21. For example, when the input/output circuit 800 operates under the first operation mode, the power supply voltage $V_{DD}$ may be applied to the second conductive line M2, and the ground voltage $V_{SS}$ may be applied to a sixth conductive line M6. As a result, the assistance circuit 813, which is composed of the second and fourth transistors TR2 and TR4, may electrically insulate the inverter 811 composed of the first and third transistors TR1 and TR3 from another device.

In contrast, when the input/output circuit 800 operates under the second operation mode, the input signal IN may be applied to the second conductive line M2, and the input signal IN may be applied to a sixth conductive line M6. As a result, the assistance circuit 813, which is composed of the second and fourth transistors TR2 and TR4, may electrically operate as a driver that improves driving ability of the inverter 811 composed of the first and third transistors TR1 and TR3.

As described above, in example embodiments described with reference to FIGS. 17 to 21, configuration and operation of input/output circuit of the SRAM may be described. However, example embodiments described with reference to FIGS. 17 to 21 are not limited thereto and may be used to a driving circuit configured to drive a plurality of loads. For example, the example embodiments may be also used to an input/output circuit of a flash memory device, an input/output circuit of a display panel, and the like.

An operation mode of the input/output circuit 800 may be selected according to the configuration of the SRAM (e.g., the number of loads), thereby improving area efficiency, insulating performance, or driving ability of the SRAM. Moreover, the reliability of the SRAM may be enhanced.

Example embodiments provide a layout of a semiconductor device that selectively operates as an insulating circuit or a driving circuit.

According to example embodiments, area efficiency, insulating performance, or driving ability of the semiconductor device may be improved.

Those of ordinary skill in the art will recognize that various changes and modifications of the example embodiments described herein can be made without departing from the scope and spirit of the inventive concepts. If modifications of the example embodiments are included within the scope of the following claims and equivalents, the inventive concepts are considered to include the modifications and variations of the example embodiments.

What is claimed is:

1. A semiconductor device comprising:
 a first active region and a second active region extended in a first direction, the first active region and the second active region being provided in a substrate;
 a first gate electrode extended in a second direction perpendicular to the first direction, wherein the first gate electrode is continuously extended on the first active region and the second active region;
 a second gate electrode extended in the second direction on the first active region;
 a third gate electrode extended in the second direction on the first active region and the second active region;
 a first contact provided on the first active region at a first side of the first gate electrode;
 a second contact provided on the first active region at a second side of the second gate electrode;
 a third contact provided on the first gate electrode;
 a fourth contact provided on the second gate electrode;
 a first conductive line connected to the first gate electrode via the third contact; and
 a second conductive line which overlaps a portion of the first contact, a portion of the second contact, and a portion of the fourth contact,
 wherein a first voltage is provided to the second conductive line,
 wherein at least part of the second conductive line extends in the first direction, and
 the at least part of the second conductive line intersects with the second gate electrode in a plan view.

2. The semiconductor device of claim 1, further comprising:
 a fourth gate electrode extended in the second direction on the second active region;
 a fifth contact provided on the second active region at the first side of the first gate electrode;
 a sixth contact provided on the second active region at the second side of the fourth gate electrode;
 a seventh contact provided on the fourth gate electrode; and
 a third conductive line which overlaps a portion of the fifth contact, a portion of the sixth contact, and a portion of the seventh contact,
 wherein a second voltage is provided to the third conductive line.

3. The semiconductor device of claim 2, wherein at least part of the third conductive line extends in the first direction, and
 the at least part of the third conductive line intersects with the fourth gate electrode in the plan view.

4. The semiconductor device of claim 2, wherein the first active region and the second active region continuously extend such that at least part of the first gate electrode, at least part of the second gate electrode, and at least part of the third gate electrode are overlap with the first active region in the plan view and at least part of the first gate electrode, at least part of the third gate electrode, and at least part of the fourth gate electrode are overlap with the second active region in the plan view.

5. The semiconductor device of claim 2, wherein first conductive line extends in the first direction,
 wherein at least part of the second conductive line extends in the first direction, and
 wherein at least part of the third conductive line extends in the first direction.

6. The semiconductor device of claim 2, wherein the seventh contact is provided on the fourth gate electrode such that not to overlap with the second active region.

7. The semiconductor device of claim 2, wherein the second voltage is a ground voltage.

8. The semiconductor device of claim 2, wherein the first gate electrode, the first active region at the first side of the first gate electrode, and a first active region at the second side of the first gate electrode comprise a first transistor,
 wherein the second gate electrode, the first active region at the first side of the second gate electrode, and a first active region at the second side of the second gate electrode comprise a second transistor,
 wherein the first gate electrode, the second active region at the first side of the first gate electrode, and the second active region at the second side of the first gate electrode comprise a third transistor,
 wherein the fourth gate electrode, the second active region at the first side of the fourth gate electrode, and the second active region at the second side of the fourth gate electrode comprise a fourth transistor.

9. The semiconductor device of claim 8, wherein the second transistor and the fourth transistor are turned-off transistors.

10. The semiconductor device of claim 1, wherein the first conductive line does not overlap with the first active region in the plan view.

11. The semiconductor device of claim 1, further comprising:
 a fourth conductive line provided on the first active region and the second active region between a second side of the first gate electrode and a first side of the second gate electrode;
 wherein the third conductive line extends in the second direction.

12. The semiconductor device of claim 1, wherein an first signal is input into the first conductive line, wherein an second signal is output from the fourth conductive line.

13. The semiconductor device of claim 1, wherein the fourth contact is provided on the second gate electrode such that not to overlap with the first active region.

14. The semiconductor device of claim 1, wherein the first active region is a PMOS region, and the second active region is an NMOS region.

15. A semiconductor device comprising:
 a first active region and a second active region extended in a first direction, the first active region and the second active region being provided in a substrate;
 a first gate electrode extended in a second direction perpendicular to the first direction, wherein the first gate electrode is continuously extended on the first active region and the second active region;
 a second gate electrode extended in the second direction on the first active region;
 a third gate electrode extended in the second direction on the first active region and the second active region;
 a fourth gate electrode extended in the second direction on the second active region, wherein the second gate electrode and the fourth gate electrode are on a common line of extent;
 a first source/drain contact provided on the first active region at a first side of the first gate electrode;
 a second source/drain contact provided on the first active region at a second side of the second gate electrode;
 a third source/drain contact provided on the second active region at the first side of the first gate electrode;

a fourth source/drain contact provided on the second active region at the first side of the third gate electrode;

a first gate contact provided on the first gate electrode;

a second gate contact provided on the second gate electrode;

a third gate contact provided on the fourth gate electrode;

a first conductive line connected to the first gate electrode via the first gate contact;

a second conductive line which overlaps a portion of the first source/drain contact, a portion of the second source/drain contact, and a portion of the second gate contact; and a third conductive line which overlaps a portion of the third source/drain contact, a portion of the fourth source/drain contact, and a portion of the third gate contact, wherein a first voltage is provided to the second conductive line, wherein a second voltage is provided to the third conductive line, wherein at least part of the third conductive line extends in the first direction, the at least part of the third conductive line intersects with the fourth gate electrode in a plan view, and wherein the first active region and the second active region continuously extend such that at least part of the first gate electrode, at least part of the second gate electrode, and at least part of the third gate electrode are overlap with the first active region in the plan view and at least part of the first gate electrode, at least part of the third gate electrode, and at least part of the fourth gate electrode are overlap with the second active region in the plan view.

16. The semiconductor device of claim 15, wherein first conductive line extends in the first direction, wherein at least part of the second conductive line extends in the first direction, and wherein at least part of the third conductive line extends in the first direction.

17. The semiconductor device of claim 15, wherein the first voltage is a power supply voltage and the second voltage is a ground voltage.

18. The semiconductor device of claim 15, wherein the second gate contact is provided on the second gate electrode such that not to overlap with the first active, and wherein the third gate contact is provided on the fourth gate electrode such that not to overlap with the second active region.

19. The semiconductor device of claim 15, wherein the second gate contact is fully overlapped with the second conductive line in the plan view, and wherein the third gate contact is fully overlapped with the third conductive line in the plan view.

20. A semiconductor device comprising:

a first active region and a second active region extended in a first direction, the first active region and the second active region being provided in a substrate;

a first gate electrode extended in a second direction perpendicular to the first direction, wherein the first gate electrode is continuously extended on the first active region and the second active region;

a second gate electrode extended in the second direction on the first active region;

a third gate electrode continuously extended in the second direction on the first active region and the second active region;

a fourth gate electrode extended in the second direction on the second active region, wherein the second gate electrode and the fourth gate electrode are on a common line of extent;

a conductive line extended in the first direction and configured to provide a supply voltage; and a gate contact provided on the second gate electrode, wherein the second gate electrode extends across the conductive line, wherein a portion of the gate contact is disposed at a cross-point of the second gate electrode and the conductive line, and wherein a gap extending in the second direction is present between the second gate electrode and the fourth gate electrode.

\* \* \* \* \*